United States Patent [19]
Shiraishi

[11] Patent Number: 5,448,336
[45] Date of Patent: Sep. 5, 1995

[54] APPARATUS AND METHOD FOR PROJECTION EXPOSURE

[75] Inventor: Naomasa Shiraishi, Kanagawa, Japan

[73] Assignee: Nikon Corporation, Tokyo, Japan

[21] Appl. No.: 274,752

[22] Filed: Jul. 14, 1994

[30] Foreign Application Priority Data

Jul. 15, 1993 [JP] Japan .................................. 5-175165

[51] Int. Cl.$^6$ ...................... G03B 27/72; G03B 27/42
[52] U.S. Cl. ......................................... 355/71; 355/53
[58] Field of Search ...................................... 355/53, 71

[56] References Cited

U.S. PATENT DOCUMENTS

| | | | |
|---|---|---|---|
| 5,208,629 | 5/1993 | Matsuo et al. | 355/53 |
| 5,311,249 | 5/1994 | Kamon et al. | 355/71 |
| 5,323,208 | 6/1994 | Fukuda et al. | 355/53 |
| 5,329,336 | 7/1994 | Hirano et al. | 355/53 |
| 5,345,292 | 9/1994 | Shiozawa et al. | 355/67 |
| 5,348,837 | 9/1994 | Fukuda et al. | 430/269 |

FOREIGN PATENT DOCUMENTS

0489426A2-/A3 10/1992 European Pat. Off. .

*Primary Examiner*—Richard A. Wintercorn
*Attorney, Agent, or Firm*—Armstrong, Westerman, Hattori, McLeland & Naughton

[57] ABSTRACT

A projection exposure apparatus having an illuminating system for irradiating a mask having a pattern with illuminating light and a projection optical system for taking in light emanating from the pattern of the mask and for projecting an image of the pattern on a photosensitive substrate. The projection exposure apparatus further includes a phase plate disposed on or near a Fourier transform plane in an image-forming optical path between the mask and the photosensitive substrate so that the amplitude of light passing through a circular region of radius $r_1$ which is centered at an optical axis of the projection optical system on the Fourier transform plane or a plane near it and the amplitude of light passing through an outer region while lies outwardly of the circular region are made different in sign from each other by the phase plate, and a movable member for moving an image-forming plane of the projection optical system and the photosensitive substrate relative to each other along the optical axis of the projection optical system when the image of the mask pattern is projected on the photosensitive substrate. The radius $r_1$ and the ratio t of the amplitude of light passing through the circular region to the amplitude light passing through the outer region are determined so as to satisfy the following condition:

$$0.85 \times (0.34 + 0.12t) \leq r_1/r_2 \leq 1.15 \times (0.34 + 0.12t)$$

where $r_2$ is the radius of a pupil plane of said projection optical system.

11 Claims, 17 Drawing Sheets

APPARATUS AND METHOD FOR PROJECTION EXPOSURE

BACKGROUND OF THE INVENTION

The present invention relates to an apparatus and method for projection exposure used for forming fine patterns in semiconductor integrated circuits, liquid crystal displays, etc.

A projection optical system used in a projection exposure apparatus of the type described above is incorporated in the apparatus after high-level optical designing, careful selection of a glassy material, ultraprecise processing, and precise assembly adjustment. The present semiconductor manufacturing process mainly uses a stepper in which a reticle (mask) is irradiated with the i-line (wavelength: 365 nm) of a mercury-vapor lamp as illuminating light, and light passing through a circuit pattern on the reticle is focused on a photosensitive substrate (e.g., a wafer) through a projection optical system, thereby forming an image of the circuit pattern on the substrate. Recently, an excimer stepper that employs an excimer laser (KrF laser of wavelength 248 nm) as an illuminating light source has also been used. When a projection optical system for such an excimer stepper only comprises a refracting lens, usable glassy materials are limited to quartz, fluorite, and so forth.

Generally speaking, in order to faithfully transfer a fine reticle pattern onto a photosensitive substrate by exposure using a projection optical system, the resolution and focal depth or depth of focus (DOF) of the projection optical system are important factors. Among projection optical systems which are presently put to practical use, there is a projection optical system having a numerical aperture (NA) of about 0.6 and employing the i-line. In general, when the wavelength of illuminating light employed is kept constant, as the numerical aperture of the projection optical system is increased, the resolution improves correspondingly. In general, however, the focal depth (DOF) decreases as the numerical aperture NA increases. The focal depth is defined by $DOF = \pm \lambda / NA^2$, where $\lambda$ is the wavelength of illuminating light. It should be noted that when the illuminating light is reduced in wavelength, the resolution improves, but that the focal depth decreases with the reduction in wavelength.

In the meantime, even if the resolution is improved by increasing the numerical aperture NA of the projection optical system, the focal depth (focus margin) DOF decreases in inverse proportion to the square of the numerical aperture, as shown in the above expression of $DOF = \pm \lambda / NA^2$. Accordingly, even if a projection optical system having a high numerical aperture can be produced, the required focal depth cannot be obtained; this is a great problem in practical use. Assuming that the wavelength of illuminating light is 365 nm of the i-line and the numerical aperture is 0.6, the focal depth DOF becomes a relatively small value, i.e., about 1 $\mu m$ ($\pm 0.5$ $\mu m$) in width. Accordingly, resolution decreases in a portion where the surface unevenness or the curvature is greater than DOF within one shot region (which is about 20 by 20 mm or 30 by 30 mm square) on the wafer. In addition, it becomes necessary in the stepper system to perform focusing, leveling, etc. for each shot region on the wafer with particularly high accuracy, thereby resulting in an increase of the load (i.e., effort required to improve measurement resolving power, servo control accuracy, setting time, etc.) on the mechanical system, the electrical system and the software.

Under these circumstances, the present applicant has proposed in, for example, Japanese Patent Unexamined Publication (KOKAI) Nos. 04-101148 and 04-225358, a novel projection exposure technique whereby the above-described problems of the projection optical system are solved, and both high resolution and a large focal depth can be obtained without using a reticle provided with a phase shifter such as that disclosed in Japanese Patent Examined Publication No. 62-50811. This proposed exposure technique enables the apparent resolution and focal depth to increase by controlling the reticle illuminating method in a special mode without modifying the existing projection optical system. This technique is called SHRINC (Super High Resolution by IllumiNation Control) method. According to the SHRINC method, the reticle is irradiated with two illuminating light beams (or four illuminating light beams) which are symmetrically inclined in the pitch direction of a line-and-space pattern (L&S pattern) on the reticle, and the 0th—order diffracted light component and either of the $\pm$1st-order diffracted light components, which are produced from the L&S pattern, are forced to pass through the pupil of the projection optical system in symmetry with respect to the optical axis, thereby producing a projected image (interference fringes) of the L&S pattern by utilizing the principle of two-beam interference (i.e., the interference between one of the 1st—order diffracted light components and the 0th—order diffracted light component). The image formation that utilizes two-beam interference makes it possible to suppress the occurrence of wavefront aberration when defocus occurs, in comparison to the conventional method (i.e., the ordinary vertical direction illumination). Therefore, the focal depth apparently increases.

However, the SHRINC method utilizes the interference of light between patterns which are relatively close to each other on the reticle, thereby improving the resolution and the focal depth. That is, the desired effect can be obtained when the pattern formed on the reticle has a periodic structure as in the case of an L&S pattern (grating pattern). However, no effect can be obtained for isolated patterns (in which the distance between patterns is relatively long), for example, contact hole patterns (fine square patterns). The reason for this is as follows: In the case of isolated fine patterns, diffracted light is produced therefrom in such a manner as to form a distribution which is approximately uniform in the direction of the angle of diffraction, and hence it does not clearly separate into the 0th—order diffracted light and higher-order diffracted lights in the pupil of the projection optical system.

Therefore, in order to enlarge the apparent focal depth for isolated patterns, e.g., contact holes, an exposure method has been proposed in which for each shot region on a wafer, the wafer is stepwisely moved along the optical axis by a predetermined amount at a time, and exposure is carried out for each stop position of the wafer, that is, exposure is carried out a plurality of times for each shot region. For example, see Japanese Patent Unexamined Publication (KOKAI) No. 63-42122 (corresponding to U.S. Pat. No. 4,869,999). This exposure method is called FLEX (Focus Latitude enhancement EXposure) method and provides satisfactory focal depth enlarging effect for isolated patterns, e.g., contact holes. However, the FLEX method indispensably requires multiple exposure of contact hole images which are slightly defocused. Therefore, the sharpness a composite optical image obtained by the multiple exposure and a resist image obtained after development inevitably decreases. Accordingly, the FLEX method suffers from problems such as degradation of the resolution of contact hole patterns which are close to each other, and lowering of the margin for the variation of the exposure degree (i.e., exposure margin).

It should be noted that the FLEX method is also disclosed in Japanese Patent Unexamined Publication (KOKAI) No. 05-13305 (corresponding to U.S. Pat. application Ser. No. 820,244, filed by the present applicant; in which the wafer is moved along the optical axis not stepwisely but continuously during exposure), and U.S. Pat. No. 5,255,050.

As another conventional technique, there has recently been proposed a technique in which a pupil filter is provided in a pupil plane of a projection optical system, that is, a plane of the projection optical system that is in Fourier transform relation to both the reticle pattern surface and the wafer surface, in an image-forming optical path between the reticle and the wafer, thereby improving the resolution and the focal depth. Examples of this technique include the Super-FLEX method published in Extended Abstracts (Spring Meeting, 1991) 29a-ZC-8, 9; The Japan Society of Applied Physics. This method is also disclosed in EP-485062A. In the Super-FLEX method, a transparent phase plate is provided at the pupil of a projection optical system so that the complex amplitude transmittance that is given to image-forming light by the phase plate successively changes from the optical axis toward the periphery in the direction perpendicular to the optical axis. By doing so, the image that is formed by the projection optical system maintains its sharpness with a predetermined width (wider than that in the conventional method) in the optical axis direction about the best focus plane (a plane that is conjugate with respect to the reticle) which is the center of said predetermined with. Thus, the focal depth increases. It should be noted that the pupil filter used in the Super-FLEX method, that is, so-called multifocus filter, is detailed in the paper entitled "Research on Imaging Performance of Optical System and Method of Improving the Same", pp.41-55, in Machine Testing Institute Report No. 40, issued on Jan. 23, 1961. For the pupil filter itself, please see U.S. Pat. No. 5,144,362.

However, the conventional Super-FLEX method suffers from the problem that the intensity of a subsidiary Peak (ringing) which occurs in the vicinity of a contact hole pattern becomes relatively strong, although the method provides satisfactory focal depth increasing effect for isolated contact hole patterns. Therefore, in the case of a plurality of contact hole patterns which are relatively close to each other, an undesirable ghost pattern is transferred to a position where ringings occurring between adjacent holes overlap each other, causing an undesired reduction in film thickness of the photoresist.

SUMMARY OF THE INVENTION

It is a principal object of the present invention to provide a projection exposure apparatus which uses a phase type optical (pupil) filter in which the radius $r_1$ of a central transmitting portion (FA) of the phase type pupil filter and the amplitude ratio t of the central transmitting portion (FA) to an outer transmitting portion (FB) are set so as to satisfy the condition of $0.85 \times (0.34 + 0.12 t) \leq r_1/r_2 \leq 1.15 \times (0.34 + 0.12 t)$ [$r_2$ is a radius equivalent to the numerical aperture (NA) of the projection optical system], which defines the optimum relationship therebetween, and wherein an image-forming plane and a wafer are moved relative to each other along an optical axis by a movable member. According to this projection exposure apparatus, it is possible to ensure the focal depth and exposure margin required for projection exposure of contact hole patterns and to enable a plurality of contact hole patterns close to each other to be satisfactorily separated in terms of the exposure light intensity, and it is also possible to minimize ringings occurring between the adjacent contact hole patterns.

It is another object of the present invention to provide a projection exposure apparatus which is designed so that a transparent plane-parallel plate can be exchangeably used in place of the above-described phase-type pupil filter, thereby allowing an ordinary exposure, which uses no phase shifting, to be carried out on the Fourier transform plane, and thus enabling suppression of the variation of image-forming characteristics (aberrations) of the projection optical system.

It is still another object of the present invention to provide a projection exposure apparatus wherein the image-forming plane of the above-described projection optical system and the above-described photosensitive substrate are stepwisely moved relative to each other in the direction of the optical axis so that exposure is carried out at each of a plurality of positions which are apart from each other by one-pitch distance $$\Delta F_1 = \lambda/(1 - \sqrt{1 - NA^2}),$$

or wherein exposure is carried out while the image-forming plane and the photosensitive substrate are being continuously moved relative to each other in the optical axis direction through at least about $$\Delta F_2 = 2\lambda/(1 - \sqrt{1 - NA^2}),$$

thereby obtaining a desired focal depth.

It is a further object of the present invention to provide a system wherein in each of the following three cases, the moving distance by which the image-forming plane of a projection optical system and a wafer are moved relative to each other is set at $$\lambda/(1 - \sqrt{1 - NA^2}):$$

a first case where in a non-scanning type projection exposure apparatus the image-forming plane and the wafer are stepwisely (i.e., one pitch at a time) moved relative to each other in the optical axis direction; a second case where in such a non-scanning type projection exposure apparatus the image-forming plane and the wafer are continuously moved relative to each other in the optical axis direction; and a third case where in a scanning type projection exposure apparatus either the image-forming plane or the wafer is continuously moved relative to the other in the optical axis direction. According to this arrangement, it is possible to ensure the focal depth and exposure margin required for projection exposure. Moreover, the moving distance can be reduced in comparison to a case where it is set at $$2\lambda/(1 - \sqrt{1 - NA^2}),$$

for example. Accordingly, it is possible to shorten the operating time and to reduce the production cost.

It is a still further object of the present invention to provide a method wherein in each of the above-described three cases, an optical filter (phase plate) is disposed on a Fourier transform plane of the projection optical system, and the image-forming plane or the wafer is moved in the optical axis direction by a distance of $$\lambda/(1 - \sqrt{1 - NA^2}).$$

According to this method, advantages similar to those described above can be obtained.

To attain the above-described objects, the present invention provides a projection exposure apparatus having an illuminating system (1 to 14) for irradiating a mask (reticle R) having a fine pattern with illuminating light (ILB) for exposure, and a projection optical system (PL) for taking in light emanating from the pattern of the reticle and for projecting an image of the pattern on a photosensitive substrate (wafer W). The projection exposure apparatus is provided with a phase plate (pupil filter PF) which is disposed on or near a Fourier transform plane (FTP) in an image-forming optical path between the mask and the photosensitive substrate so that the amplitude of light passing through a circular region (FA) of radius $r_1$ which is centered at an optical axis (AX) of the projection optical system (PL) on the Fourier transform plane or a plane near it and the amplitude of light passing through an outer region (FB) which lies outwardly of the circular region (FA) are made different in sign from each other by the phase plate. The projection exposure apparatus is further provided with a movable member (wafer stage WST) for moving the image-forming plane of the projection optical system and the photosensitive substrate relative to each other along the optical axis when the image of the pattern is projected on the photosensitive substrate. In addition, the radius $r_1$ of the circular region (FA) and the ratio t of the amplitude of light passing through the circular region (FA) to the amplitude of light passing through the outer region (FB) are determined so as to satisfy the following condition:

$$0.85 \times (0.34 + 0.12t) \leq r_1/r_2 \leq 1.15 \times (0.34 + 0.12t)$$

where $r_1$ is the radius of the pupil plane that corresponds to the numerical aperture (NA) of the projection optical system.

The projection exposure apparatus may be further provided with an exchanging device (20, 30) whereby the phase plate can be inserted into and removed from the image-forming optical path, and when the phase plate is withdrawn from the image-forming optical path, a transparent plane-parallel plate (PF3) having an optical thickness approximately equal to that of the phase plate is disposed on or near the Fourier transform plane.

In addition, when the image-forming plane of the projection optical system and the photosensitive substrate are stepwise moved relative to each other by the movable member, exposure is carried out at each of a plurality of discrete positions which are apart from each other in the direction of the optical axis AX by $$\lambda/(1 - \sqrt{1 - NA^2}),$$

where $\lambda$ is the wavelength of illuminating light, and NA is the numerical aperture of the projection optical system at the photosensitive substrate side thereof. On the other hand, when the image-forming plane of the projection optical system and the photosensitive substrate are continuously moved relative to each other in the direction of the optical axis AX by the movable member, they are moved relative to each other by at least about $$2\lambda/(1 - \sqrt{1 - NA^2}),$$

In addition, the present invention provides a projection exposure apparatus having a projection optical system for projecting an image of a fine pattern formed on a mask onto a photosensitive substrate, and an optical filter disposed on or near a Fourier transform plane in the projection optical system so that the amplitude of light passing through a circular region centered at the optical axis of the projection optical system and the amplitude of light passing through an outer region which lies outwardly of the circular region are made different in sign from each other by the optical filter. The image-forming surface of the projection optical system and the photosensitive substrate are moved relative to each other along the optical axis of the projection optical system by at least about $$\lambda/(1 - \sqrt{1 - NA^2}),$$

where $\lambda$ is the wavelength of light illuminating the mask, and NA is the numerical aperture of the projection optical system at the photosensitive substrate side thereof.

In addition, the present invention provides an exposure method that uses a projection optical system. The method includes the step of disposing an optical filter on or near a Fourier transform plane in the projection optical system so that the amplitude of light passing through a circular region centered at the optical axis of the projection optical system and the amplitude of light passing through an outer region which lies outwardly of the circular region are made different in sign from each other by the optical filter, and the step of moving, when an image of a fine pattern on a mask is formed on a photosensitive substrate through the projection optical system, the image-forming plane of the projection optical system and the photosensitive substrate relative to each other along the optical axis of the projection optical system by at least about $$\lambda/(1 - \sqrt{1 - NA^2}),$$

where $\lambda$ is the wavelength of light illuminating the mask, and NA is the numerical aperture of the projection optical system at the photosensitive substrate side thereof.

DESCRIPTION OF THE PREFERRED EMBODIMENTS

Figure 1:
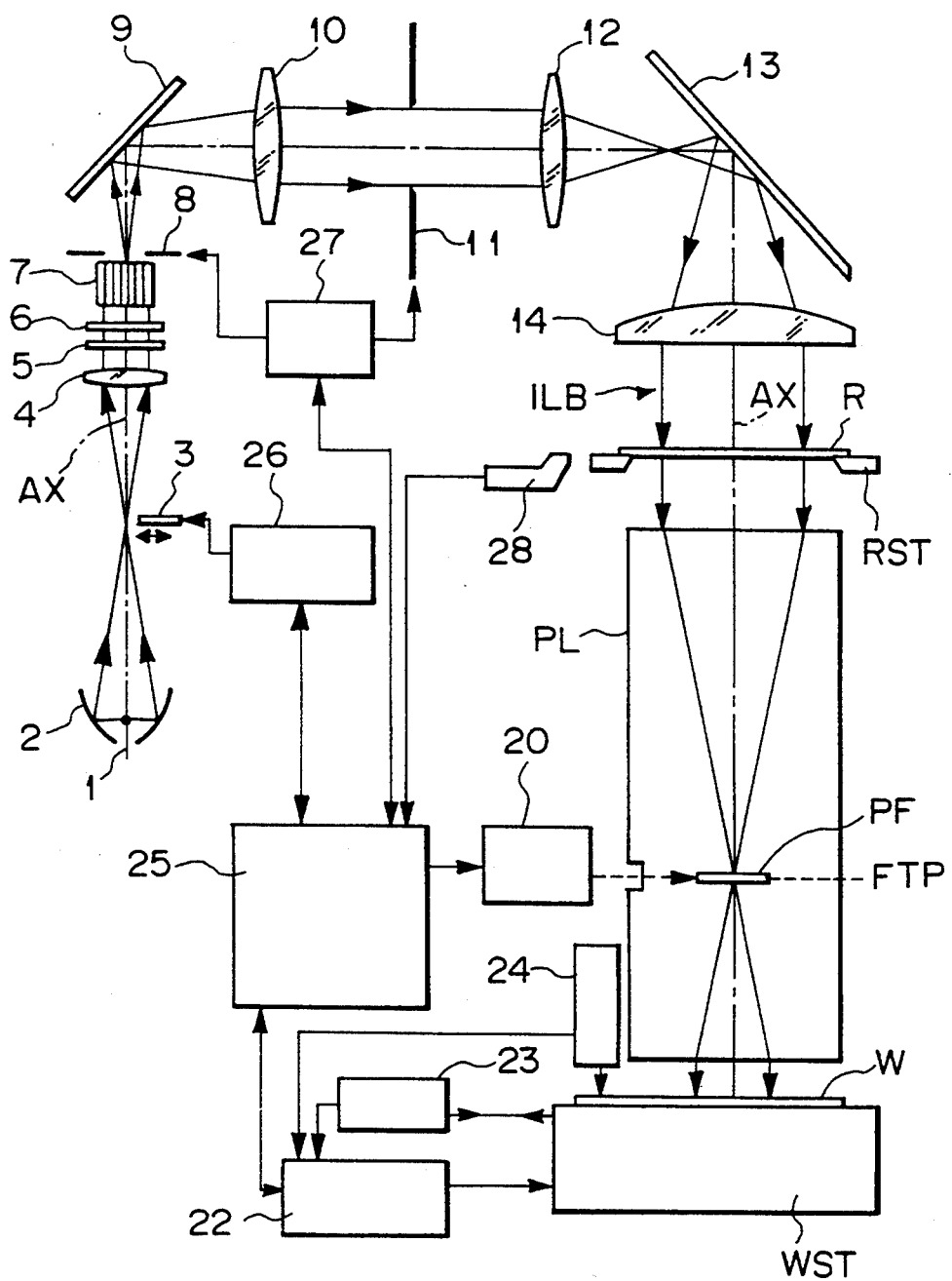
FIG. 1 shows the whole arrangement of a projection exposure apparatus according to one embodiment of the present invention.

FIG. 1 shows the general arrangement of a projection exposure apparatus (hereinafter referred to as "stepper" according to circumstances) according to one embodiment of the present invention. Referring to FIG. 1, light of high luminance emitted from a mercury-vapor lamp 1 is converged on the secondary focal point of an elliptical mirror 2 by the elliptical mirror 2. Thereafter, the light is incident on a collimator lens 4 in the form of divergent light. A rotary shutter 3 is disposed at a secondary focal point of the elliptical mirror 2 (which is a front focal point of the collimator lens 4) to control an exposure operation such that illuminating light is selectively passed and cut off. Illuminating light converted into an approximately parallel beam of light by the collimator lens 4 is successively incident on a short-wavelength cut filter 5 and an interference filter 6, where only a desired spectral line required for exposure, e.g., the i-line, is extracted. The illuminating light (i-line) emanating from the interference filter 6 then enters a fly-eye lens 7 which serves as an optical integrator. Of course, a wavelength other than the i-line or a plurality of wavelengths may be used, and the light source may be a laser or other suitable light source.

The Illuminating light (approximately parallel light beam) incident on the fly-eye lens 7 is divided by a plurality of lens elements, so that a secondary light source image (i.e., an image of a light-emitting point of the mercury-vapor lamp 1) is formed on the exit side of each lens element. Accordingly, point light source images, the number of which is the same as the number of lens elements, are distributed to form a surface light source image on the exit side of the fly-eye lens 7. A variable stop 8 is provided on the exit side of the fly-eye lens 7 to control the size of the surface light source image. The illuminating light (divergent light) passing through the stop 8 is reflected by a mirror 9 to enter a condenser lens system 10. Thereafter, the illuminating light irradiates a rectangular aperture provided in a reticle blind 11 with a uniform illuminance distribution. In FIG. 1, among a plurality of illuminating light beams from a plurality of secondary light source images (point light sources) formed on the exit side of the fly-eye lens 7, only the illuminating light from one secondary light source image lying on an optical axis AX is shown as a typical illuminating light beam. The exit side of the fly-eye lens 7 (i.e., the surface where the secondary light source images are formed) forms a Fourier transform plane with respect to the rectangular aperture plane of the reticle blind 11. Accordingly, illuminating light beams which are emitted from a plurality of secondary light source images formed by the fly-eye lens 7 and which are incident on the condenser lens system 10 are superimposed on one another on the reticle blind 11 in the form of parallel light beams which are slightly different in incident angle from each other.

The illuminating light passing through the rectangular aperture in the reticle blind 11 passes through a lens system 12 and enters a condenser lens 14 via a mirror 13. Light that emanates from the condenser lens 14 reaches a reticle R as an illuminating light beam ILB. In this system, the rectangular aperture plane of the reticle blind 11 and the pattern surface of the reticle R are disposed so as to be conjugate with respect to each other by a composite lens system that is composed of the lens system 12 and the condenser lens 14. Accordingly, an image of the rectangular aperture of the reticle blind 11 is formed so as to contain a rectangular pattern forming region formed in the pattern surface of the reticle R. As shown in FIG. 1, among illuminating light beams from the secondary light source images formed by the fly-eye lens 7, the illuminating light beam ILB from one secondary light source image that lies on the optical axis AX is a parallel light beam which is not tilted with respect to the optical axis AX on the reticle R. The reason for this is that the reticle side of the projection optical system PL is telecentric. Since a large number of secondary light source images which lie off the optical axis AX (i.e., point light sources) are formed on the exit side of the fly-eye lens 7, all illuminating light beams from these secondary light source images are parallel light beams which are tilted with respect to the optical axis AX on the reticle R, and these illuminating light beams are superimposed on one another in the pattern forming region, as a matter of course. It should be noted that the pattern surface of the reticle R and the exit-side surface of the fly-eye lens 7 are optically placed in Fourier transform relation to each other by a composite lens system composed of the condenser lens system 10, the lens system 12 and the condenser lens 14, as a matter of course. The range o of incident angles of the illuminating light beam ILB to the reticle R varies according to the aperture diameter of the stop 8. That is, as the practical area of the surface light source is reduced by reducing the aperture diameter of the stop 8, the incident angle range o also decreases. Thus, the stop 8 serves to control the spatial coherency of the illuminating light. As a factor that represents the degree of spatial coherency of the illuminating light, the ratio ($\sigma$ value) of the sine of the maximum incident angle o/2 of the illuminating light beam ILB to the reticle-side numerical aperture (Nar) of the projection optical system PL is employed. In general, the $\sigma$ value is defined as $\sigma = \sin(o/2)/\text{Nar}$. Many steppers which are presently in operation are used in the $\sigma$ range of about 0.5 to about 0.7. In the present invention, $\sigma$ may assume any value; in an extreme case, it may be in the range of about 0.1 to about 0.3. If necessary, a modified light source stop according to the above-described SHRINC method or an annular stop may be used.

Incidentally, the pattern surface of the reticle R has a predetermined reticle pattern formed from a chromium layer. Let us assume that the reticle R has a chromium layer deposited on the whole pattern surface thereof and formed with a plurality of contact hole patterns defined by fine rectangular openings (i.e., transparent portions where no chromium layer is present). A contact hole pattern may be designed so that when projected on a wafer W, the contact hole pattern have a size of not larger than 0.5 by 0.5 $\mu$m square (or a diameter of not larger than 0.5 $\mu$m). The size of contact hole patterns as measured on the reticle R is determined by taking into consideration the projection magnification M of the projection optical system PL. Generally, in a case where the distance between a pair of adjacent contact hole patterns is considerably greater than the opening size of one contact hole pattern, each contact hole pattern is called an "isolated fine pattern". That is, in many cases, each pair of adjacent contact hole patterns are sufficiently apart from each other to such an extent that beams of light (diffracted light or scattered light) produced from these contact hole patterns will not strongly affect each other as in the case of diffraction gratings. However, there are some reticles which have contact hole patterns formed relatively close to each other, as described later in detail. With such reticles, light beams produced from the contact hole patterns affect each other [see FIG. 14(A)] as in the case of diffraction gratings; therefore, care is necessary.

Referring to FIG. 1, the reticle R is retained on a reticle stage RST, and an optical image (light intensity distribution) of the contact hole patterns on the reticle R is formed on a photoresist layer provided on the surface of the wafer W through the projection optical system PL. In FIG. 1, an optical path from the reticle R to the wafer W is shown by only the chief ray in the bundle of image-forming light rays. A phase type pupil filter PF is provided on a Fourier transform plane (hereinafter referred to as "pupil plane") FTP in the projection optical system PL. The pupil filter PF has a diameter which is sufficiently large to cover the maximum diameter (corresponding to the numerical aperture NA) of the pupil plane of the projection optical system PL, and is secured to a retaining member (e.g., a turret plate, a slider, etc.) 30 which is moved by an exchanging mechanism 20 so that the pupil filter PF can extend into and withdraw from the optical path.

If the stepper is used for exposure of only contact hole patterns including no L&S pattern, the pupil filter PF may be fixed in the projection optical system PL. However, in a case where an exposure operation for a lithography process is carried out by using a plurality of steppers, is not efficient to assign a specific stepper to exposure for contact hole patterns from the viewpoint of achieving the most efficient use of each stepper. Therefore, it is preferable to provide the pupil filter PF such that it can be selectively inserted into and removed from the pupil plane (Fourier transform plane) FTP of the projection optical system PL, thereby enabling the stepper to be also used for exposure of a reticle pattern (e.g., L&S pattern) other than contact hole patterns. It should be noted that in some projection optical systems a circular aperture stop (NA varying stop) may be provided at the pupil position (Fourier transform plane FTP) in order to vary effective pupil diameter. In this case, the NA varying stop and the pupil filter PF are disposed so as not to mechanically interfere with each other and yet lie as close to each other as possible. It should be noted that one example of the NA varying stop is disclosed in U.S. Pat. No. 4,931,830.

The wafer W is retained on a wafer stage WST which is adapted to move two dimensionally in a plane perpendicular to the optical axis AX (this movement will hereinafter be referred to as "XY movement") and also move slightly in a direction parallel to the optical axis AX (this movement will hereinafter be referred to as "Z movement"). The XY movement and Z movement of the wafer stage WST are effected by a stage driving unit 22. The XY movement is controlled according to a coordinate value measured by a laser interferometer 23, whereas the Z movement is controlled according to a value detected by a focus sensor 24 used for autofocusing. The stage driving unit 22, the exchanging mechanism 20, etc. operate on the basis of a command issued from a main control unit 25. The main control unit 25 also sends a command to a shutter driving unit 26 to control the opening and closing operation of the shutter 3 and further sends a command to an aperture control unit 27 to control the aperture size (or opening degree) of the stop 8 or the reticle blind 11. Further, the main control unit 25 is capable of inputting a reticle name read by a bar code reader 28 which is provided in the path for transporting a reticle to the reticle stage RST. Accordingly, the main control unit 25 generally controls the operation of the exchanging mechanism 20 and the operation of the aperture control unit 27 according to an inputted reticle name, thereby making it possible to automatically control the aperture sizes of the stop 8 and the reticle blind 11 and whether or not the pupil filter PF is required (and also selection of the most suitable pupil filter) in conformity to the reticle used. It should be noted that the Z movement may be effected by the projection optical system PL in place of the wafer stage WST.

Figure 2:
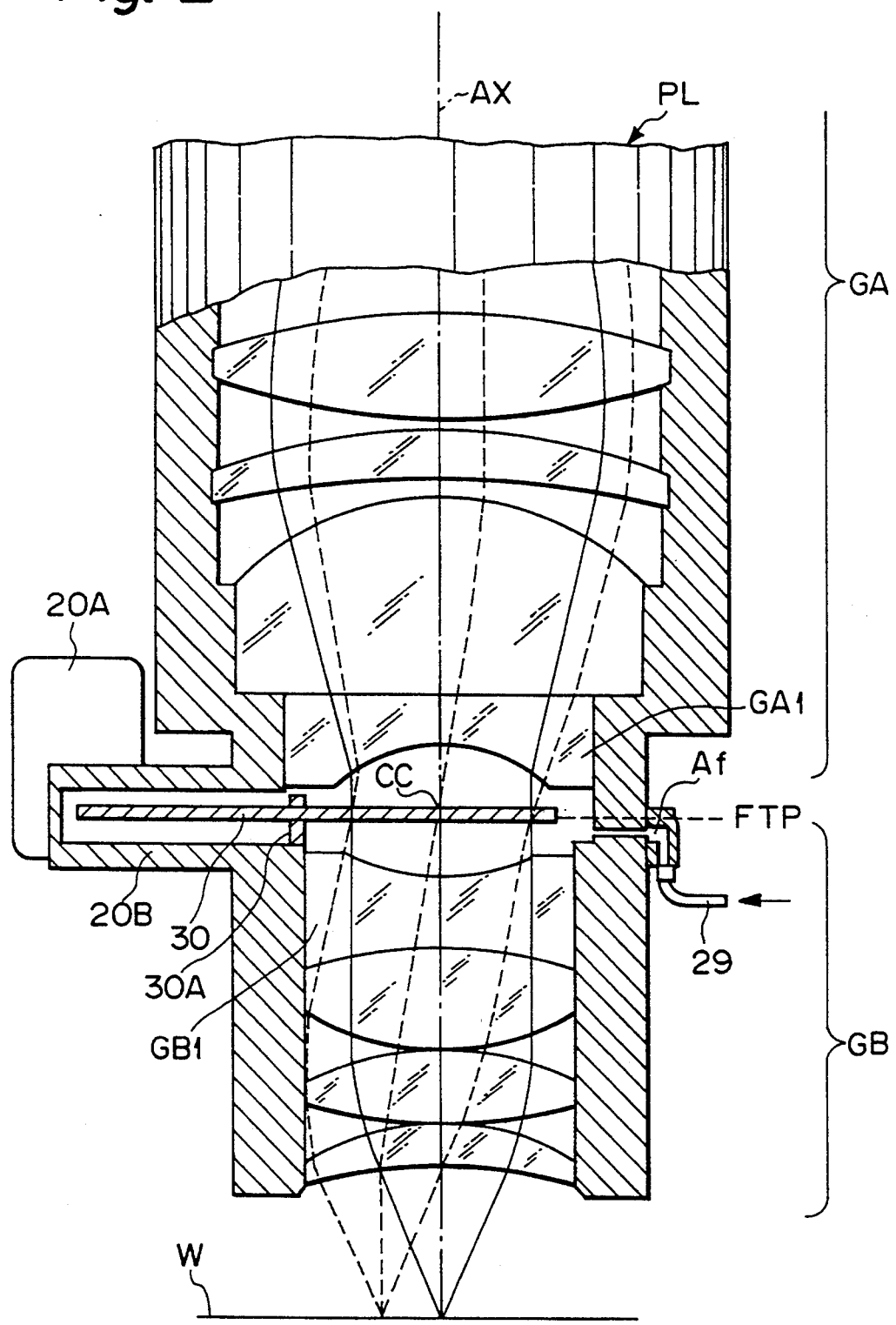
FIG. 2 is a sectional view showing the structure of a part of a projection optical system shown in FIG. 1.

The structure of a part of the projection optical system PL shown in FIG. 1 will be explained below with reference to FIG. 2. FIG. 2 Is a fragmentary sectional view showing a part of the projection optical system PL that is made of a refractive glassy material in its entirety. The Fourier transform plane (pupil plane) FTP is present in the space defined between the lowermost lens $GA_1$ of a front lens system GA and the uppermost lens $GB_1$ of a rear lens system GB. The projection optical system PL has a plurality of lenses retained by a lens barrel. In this embodiment, a plurality of pupil filters PF are exchangeably positioned in an opening in a part of the lens barrel by rotation of the retaining member 30 which retains the pupil filters PF. Further, a cover 20B extends from the opening of the lens barrel so as to prevent the retaining member 30 and a driving shaft 30A from being entirely or partly exposed directly to tile outside air. The cover 20B prevents minute dust floating in the outside air from entering the pupil space in the projection optical system PL. In addition, an actuator 20A, e.g., a rotating motor, is connected to the exchanging mechanism 20 so that a plurality of pupil filters can be alternately positioned on the pupil plane FTP of the projection optical system PL by the rotation of the retaining member 30, as described above. Further, a flow path Af is provided in a part of the lens barrel so as to communicate with the pupil space. Thus, temperature-controlled clean air is supplied to the pupil space through a pipe 29 and the flow path Af, thereby suppressing not only the rise in temperature of the pupil filter PF caused by absorption of exposure light but also the rise in temperature of the whole pupil space. It should be noted that if the clean air forcibly supplied to the pupil space is forcibly discharged through the exchanging mechanism 20 and the actuator 20A, it is possible to prevent dust generated from the exchanging mechanism 20, the retaining member 30, etc. from entering the pupil space.

Figure 3:
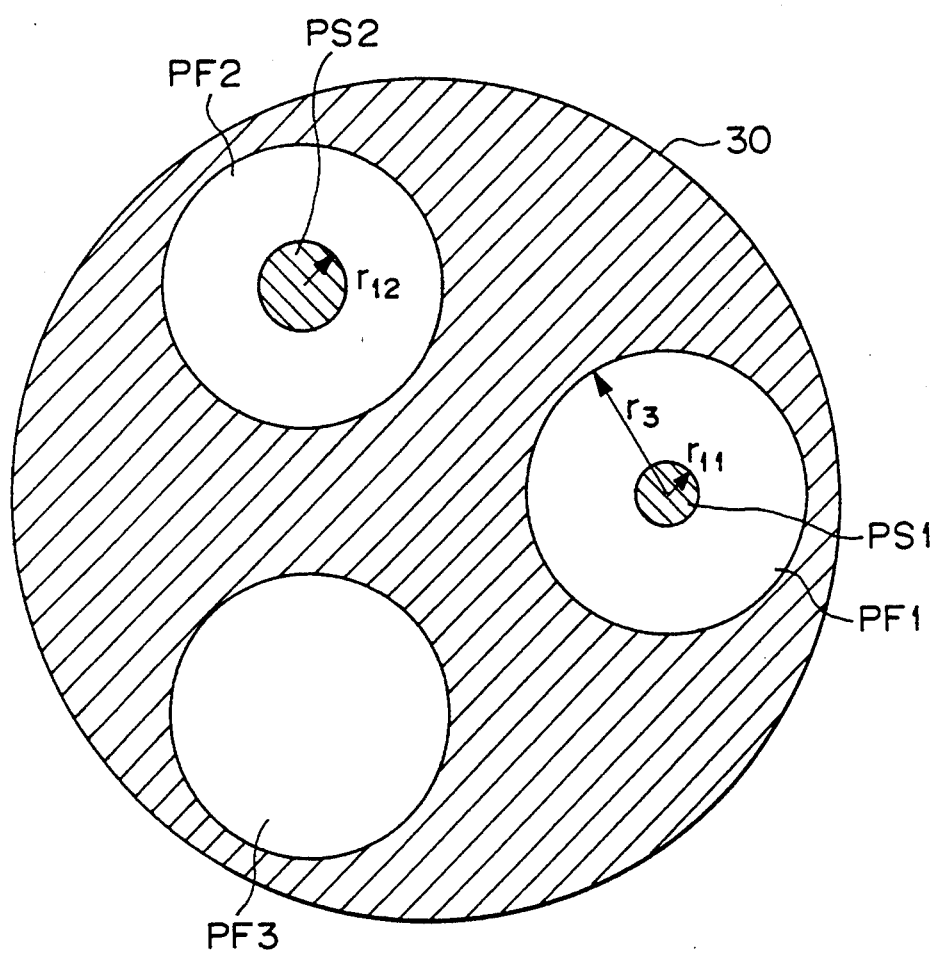
FIG. 3 shows one example of the arrangement of a retaining member provided with a plurality of phase type pupil filters shown in FIG. 2.

FIG. 3 shows a specific arrangement of the retaining member 30 in FIG. 2. In this embodiment, three pupil filters PF1 to PF3 are secured to a turret-shaped disk at equal angular spacings. The three pupil filters PF1 to PF3 each have a radius $r_3$ which is sufficiently large to cover the maximum radius of the pupil plane of the projection optical system PL, so that image-forming light distributed in the pupil plane FTP always passes through the pupil filter independently of the aperture diameter (radius $r_2$) of the NA stop described above. The pupil filter PF3 is particularly used for exposure of L&S patterns. Therefore, it is disposed on the pupil plane FTP when ordinary exposure (including the SHRINC method and the annual illumination method), which employs no phase shifter, is to be carried out. The pupil filter PF3 is a transparent plane-parallel plate (e.g., a quartz substrate) having a thickness (optical thickness) approximately equal to that of the pupil filters PF1 and PF2. The pupil filter PF3 is used to minimize variation of the image-forming characteristics (aberrations) of the projection optical system PL.

The pupil filters PF1 and PF2 are phase type pupil filters according to the present invention, which are formed by depositing phase shifters PS1 and PS2 [e.g., spin-on-glass (SOG)] having a predetermined thickness and radius $r_1$ in respective central circular regions (hatched portions in FIG. 3) of transparent substrates made, for example, of quartz. Accordingly, in the pupil filters PF1 and PF2, the amplitude of light passing through the central circular transmitting portions (phase shift portions PS1 and PS2), that is, the transmittance of the circular transmitting portions, is different from the amplitude of light passing through the outer portions (the naked portions of the transparent substrates), that is, the transmittance of the substrate naked portions. The thickness of the phase shifters PS1 and PS2 is adjusted so that a phase difference of $(2m+1)\pi[rad]$ (where m is an integer) is given between light transmitting through the central circular transmitting portion and light passing through the substrate naked portion.

Incidentally, in this embodiment, the pupil filters PF1 and PF2 are made different from each other in the radius $r_1$ of the circular transmitting portion PS and also in the amplitude transmittance. That is, the circular transmitting portions PS1 and PS2 of the pupil filters PF1 and PF2 have different radii $r_{11}$ and $r_{12}$ and different amplitude transmittances. The reason for this is that in the pupil filter according to the present invention, at least either of optimal values for the radius $r_1$ of the circular transmitting portion and the amplitude transmittance ratio between the circular transmitting portion and the substrate naked portion, which lies outwardly of it, changes according to the numerical aperture NA (pupil plane diameter) of the projection optical system PL. (It should be noted that in this embodiment the amplitude transmittance ratio is equivalent to the amplitude transmittance of the circular transmitting portion because the ratio is determined by depositing a phase shifter on the circular transmitting portion). Accordingly, two pupil filters which are different in forming conditions from each other are prepared in order to allow an optimal pupil filter to be used for each of two values of the numerical aperture NA in a stepper in which the numerical aperture NA of the projection optical system PL can be varied by an NA varying stop [designed to vary the pupil radius ($=r_2$) at the Fourier transform plane FTP] as described above. However, the present invention is not necessarily limited to the described arrangement. That is, the structure of the retaining member 30 may be modified so that four or more different types of pupil filter are provided, thereby enabling optimization of the radius of the circular transmitting portion and the amplitude transmittance for each of three or more different numerical apertures NA, i.e., allowing an optimal pupil filter to be used for each numerical aperture NA.

Figure 4:
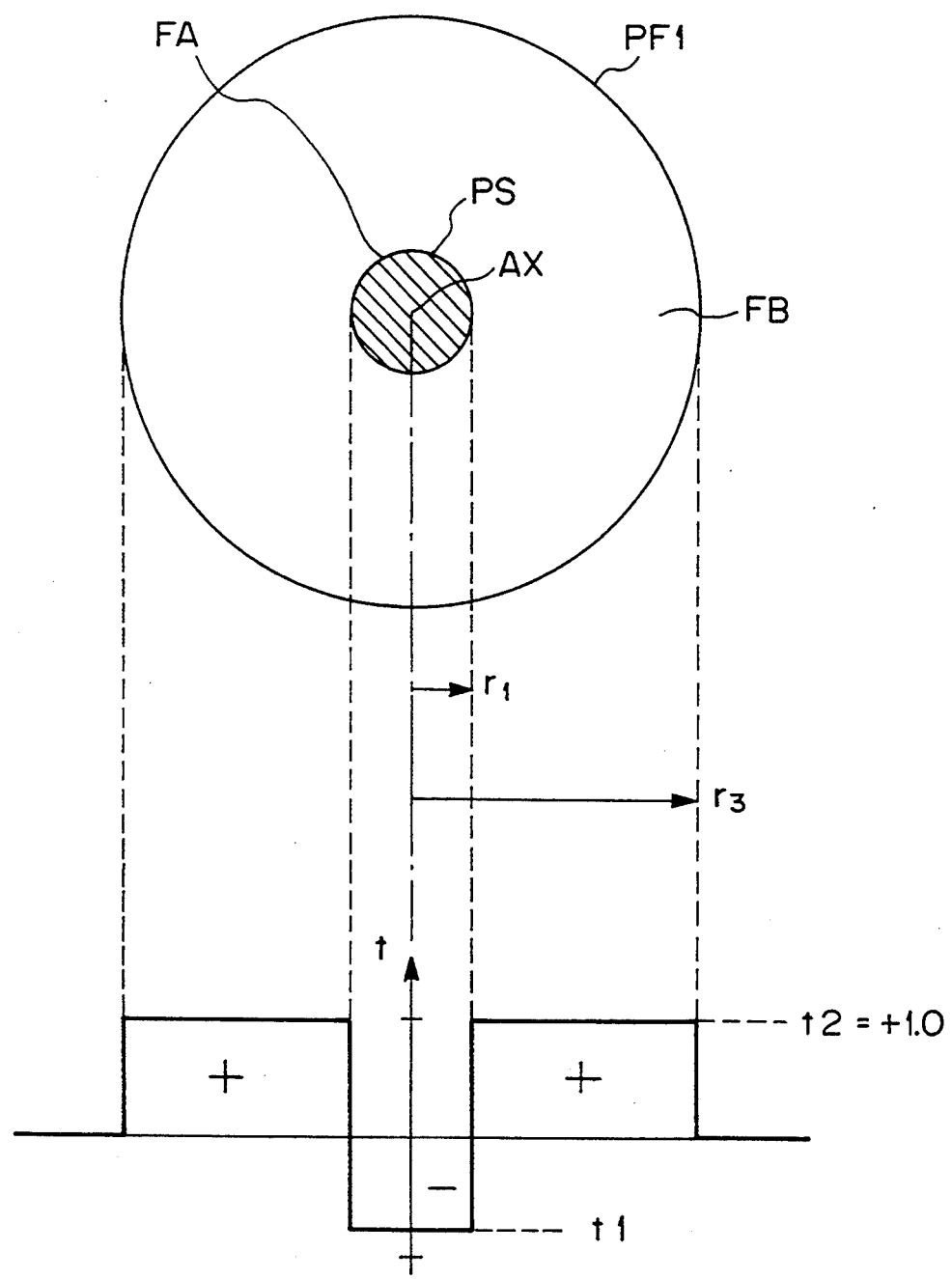
FIG. 4 shows one specific example of the arrangement of the phase type pupil filters shown in FIG. 1.

FIG. 4 shows one example of the arrangement of the phase type pupil filter PF1 according to the present invention. It is assumed that the pupil filter PF1 has been loaded in the projection optical system PL with the center thereof made coincident with the optical axis AX. Referring to FIG. 4, the pupil filter PF1 has a phase shifter PS deposited in a circular transmitting portion (region FA) having a radius $r_1$ centered at the optical axis AX, and further has an outer region (region FB) provided outwardly of the circular region FA. Assuming that the amplitude of light passing through the outer region FB is $t_2 = +1.0$ (reference), the phase of light passing through the phase shifter PS in the circular region FA is inverted, and the absolute value of the amplitude thereof becomes $t_1$ (a negative real number) smaller than 1.0, thus causing extinction of the light to a certain extent. The extinction of the light can be obtained, for example, by forming the phase shifter PS itself from a light-absorbing material. However, the phase shifter may be formed from a double-layer film, for example, which is composed of a thin metallic film (having a predetermined transmittance to allow a part of light to pass therethrough) and a light-transmitting phase shifter. It should be noted that in FIG. 4 the outer radius $r_3$ of the pupil filter PF is equal to the maximum numerical aperture (i.e., the maximum radius of the pupil plane) of the projection optical system PL. However, the radius $r_3$ of the pupil filter PF may be larger than the maximum radius of the pupil plane in practice because in a region having a diameter larger than tile radius $r_3$ the image-forming light is blocked by the above-described NA stop, which is provided in the projection optical system PL. In addition, the pupil filter PF itself can be used as an aperture stop (NA stop) by making the outer radius $r_3$ of the pupil filter PF smaller than the maximum radius of the pupil plane of the projection optical system.

The present invention intends to minimize ringings while ensuring a satisfactory focal depth and exposure margin by jointly using the above-described phase type pupil filter PF (shown in FIG. 4) and a conventional FLEX method. Therefore, in this embodiment the wafer stage WST for retaining the wafer W, as shown in FIG. 1, performs the function of a conventional FLEX method. That is, the wafer stage WST serves to move or vibrate the wafer W in the direction of the optical axis AX during exposure.

As a result of extensive simulation made by the present inventor, the following has been found: Assuming that the ratio of the amplitude transmittance $t_1$, of the circular transmitting portion FA to the amplitude transmittance $t_2$ of the outer transmitting portion FB is $t$ $(= t_1/t_2)$, the radius $r_1$ and the ratio $t$ $(= t_1/t_2)$ in the pupil filter PF1 shown in FIG. 4 should be determined so as to satisfy the following relationship:

$$r_1 = (0.34 + 0.12t)r_2$$

This is the optimal solution for minimizing ringings while ensuring a satisfactory focal depth and exposure margin in the pupil filter PF. It should be noted that in the above expression, $r_2$ is the radius of the aperture stop (NA varying stop), provided at the pupil plane FTP as described above; alternatively, $r_2$ is the radius of the pupil plane in the case of a projection optical system having no aperture stop provided at the pupil plane. Since the amplitude transmittance $t_2$ of the outer region FB, that is, the naked transparent portion of the substrate, is a fixed value, the radius $r_1$ and the amplitude transmittance $t_1$ should be controlled so as to satisfy the above relationship.

In a case where the numerical aperture of the projection optical system PL is varied by the NA varying stop provided at the Fourier transform plane FTP, the value of the pupil plane radius $r_2$ in the above relationship changes. Therefore, the pupil filter PF must be changed to a pupil filter in which at least either of the radius $r_1$ and the amplitude transmittance $t_1$ has been changed so as to conform to the numerical aperture varied. In actual practice, however, the radius $r_1$ is not necessarily limited to $(0.34+0.12t)r_2$, which is defined by the above expression. Practically, satisfactory performance can be obtained as long as the radius $r_1$ is in a range determined by making allowances of about $\alpha 15\%$ for the limits defined by the above expression (i.e., in the range of $0.85\ r_1$ to $1.15\ t_1$). That is, in the pupil filter PF shown in FIG. 4 the radius $r_1$ and the amplitude transmittance $t_1$ may be determined so as to satisfy the following relationship:

$$0.85 \times (0.34 + 0.12t)r_2 \leq r_1 \leq 1.15 \times (0.34 + 0.12t)r_2$$

Accordingly, the pupil filter PF can be used without a need of change as long as the amount of change of the numerical aperture of the projection optical system PL caused by the NA varying stop, which is provided at the Fourier transform plane FTP, is in the range of about $\pm 15\%$.

Further, the present invention uses a FLEX method in combination with the phase type pupil filter, for example, a method in which for each shot region on a wafer, the wafer is stepwisely moved along the optical axis by a predetermined amount at a time, and exposure is carried out for each stop position of the wafer, that is, exposure is carried out a plurality of times for each shot region, as disclosed in U.S. Pat. No. 4,869,999. In this method, the interval between a pair of adjacent exposure positions among a plurality of discrete exposure positions (i.e., the amount of movement of the wafer W per exposure operation) $\Delta F_1$ is determined to be approximately equal to $$\lambda/(1 - \sqrt{1 - NA^2}),$$

where $\lambda$ is the wavelength of the illuminating light ILB, and NA is the numerical aperture of the projection optical system PL at the wafer side thereof.

The reason for this is that the above-described amount of movement has been found to be the optimal value in this method by the present inventor.

When a FLEX method wherein the wafer W is continuously moved along the optical axis during exposure is employed in the present invention, the moving range $\Delta F_2$ is determined to be at least about $$2\lambda/(1 - \sqrt{1 - NA^2}).$$

The reason for this is also that the above-described range of movement has been found to be the optimal value by the present inventor. In a case where the wafer W is vibrated in particular, the amplitude of the vibration is preferably determined to be larger than about an intermediate value between the above two amounts of movement $\Delta F_1$ and $\Delta F_2$, for example.

There has heretofore been proposed a method wherein when the wafer W is continuously moved as described above, the speed of movement of the wafer W is appropriately controlled, thereby obtaining an advantageous effect approximately equal to that obtained by the method wherein the wafer W is stepwisely moved (to carry out exposure at discrete positions), as disclosed in, for example, Japanese Patent Unexamined Publication (KOKAI) Nos. 05-13305 and 05-47625, and U.S. Pat. No. 5,255,050. When this continuously moving method is employed, the amount of movement is not set at the above-described value, i.e., $$\Delta F_2 = 2\lambda/(1 - \sqrt{1 - NA^2}),$$

but determined to be approximately equal to or larger than the interval between a pair of adjacent exposure positions among a plurality of discrete exposure positions in the stepwisely moving method, i.e., $$\Delta F_1 = \lambda/(1 - \sqrt{1 - NA^2}).$$

It should be noted that in a case where exposure is carried out with the wafer W being stepwisely or continuously moved, as described above, the wafer W is moved in an approximately symmetrical range with respect to the best focus position of the projection optical system PL in the optical axis direction.

Incidentally, for the movement of the wafer W, the movement of the wafer stage WST may be controlled on the basis of a value measured by a position measuring device, e.g., an encoder, which may be provided on a wafer moving mechanism inside the wafer stage WST. Alternatively, the wafer stage WST may be controlled on the basis of a value detected by the focus sensor 24 or the like in the arrangement shown in FIG. 1. It is also possible to move the reticle R in place of the wafer W during exposure. In this case, however, the amount of movement must be increased by an amount corresponding to the longitudinal magnification (the square of the lateral magnification) of the projection optical system PL. That is, if the projection optical system PL is a 5×system (i.e., 1/5 reduction system), for example, the amount of movement of the reticle R is 25 times the amount of movement of the wafer W. It should be noted that the image-forming plane of the projection optical system PL may be shifted along the optical axis by moving at least a part of optical elements constituting the projection optical system PL or slightly changing the wavelength of the illuminating light ILB applied to the reticle R. In this case, the amount of shift of the image-forming plane is determined to be approximately equal to the amount of movement of the wafer W, described above.

In the foregoing embodiment, the present invention is applied to a projection exposure apparatus (e.g., a stepper) wherein with both the reticle and the wafer kept stationary, the whole area of a pattern forming region on the reticle is illuminated, thereby projecting an image of a circuit pattern formed in the pattern forming region onto the wafer. However, the present invention may also be applied to a projection exposure apparatus wherein an image of the circuit pattern on the reticle is projected on the wafer by a scanning exposure method, that is, a scanning type projection exposure apparatus wherein only a part of the pattern forming region on the reticle is illuminated, and the reticle and the wafer are synchronously moved in a direction perpendicular to the optical axis of the projection optical system, thereby projecting an image of the circuit pattern on the wafer, as disclosed in U.S. Pat. Nos. 4,924,257, 5,194,893 and 5.281,996. However, such a scanning type projection exposure apparatus employs a FLEX method wherein the image-forming plane of the projection optical system and the wafer are continuously moved relative to each other along the optical axis of the projection optical system, as disclosed, for example, in U.S. Pat. No. 5,255,050. Accordingly, during scanning exposure that is carried out in the scanning type projection exposure apparatus, the image-forming plane of the projection optical system and the wafer are moved relative to each other through about $$\lambda/(1 - \sqrt{1 - NA^2}),$$

or more while one point on the wafer crosses a region of thereticle pattern projected by the projection optical system (i.e., a region similar to an illuminated region on the reticle).

Next, the effect of the present invention will be explained on the basis of the results of simulation in which the pupil filter PF in this embodiment (FIG. 4) and a FLEX method were used in combination.

Figure 6A:
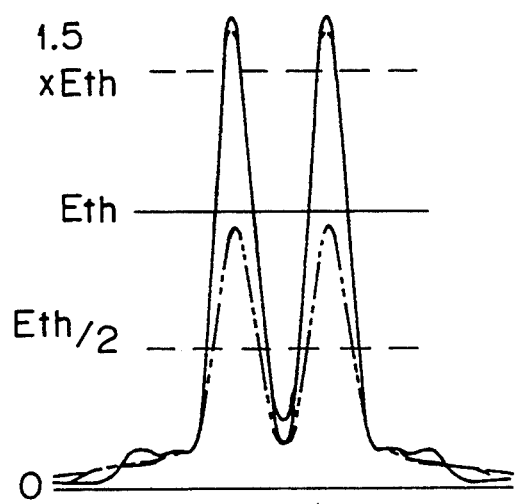
FIGS. 6(A) and 6(B) are graphs each showing results of simulation in which the effect of a first embodiment of the present invention on a plurality of hole patterns is represented by an image intensity distribution.
Figure 6B:
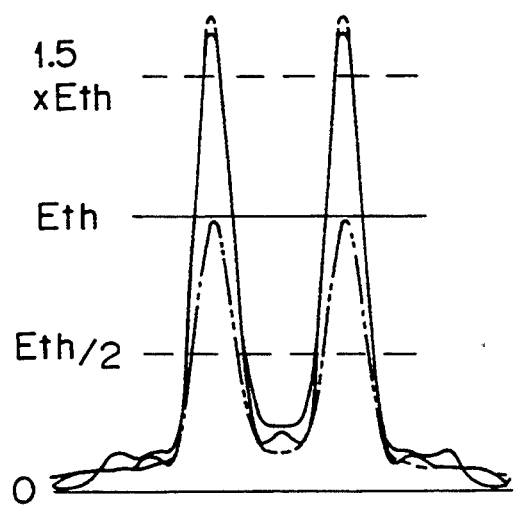

FIGS. 6(A) and 6(B) each show results of simulation (cross-sectional intensity distribution) of an optical image of contact hole patterns when the radius $r_1$ and amplitude transmittance $t_1$ of the circular transmitting portion FA in FIG. 4 were set at $r_1 = 0.22 \times r_2$ and $t_1 = -1.0$ ($t_2 = +1.0$). The exposure conditions were as follows: the wavelength of the illuminating light ILB was 0.365 $\mu$m of the i-line; the numerical aperture NA of the projection optical system PL (at the wafer side) was 0.57; and the $\sigma$ value of the illuminating optical system was 0.6. In addition, the stepwise movement type FLEX method in which exposure was carried out at each of two discrete positions was used in combination with the pupil filter PF, and the interval (distance) $\Delta F_1$ between the two positions was set at $$\Delta F_1 = \lambda/(1 - \sqrt{1 - NA^2}) = 2.0[\mu m].$$

Figure 5A:
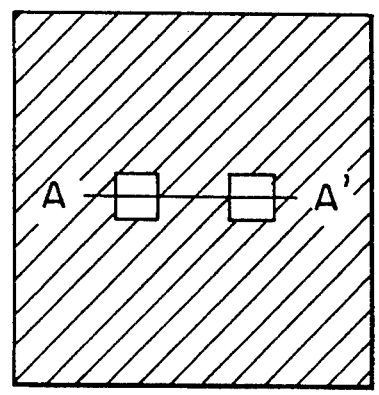
FIG. 5(A) shows two contact holes which are relatively close to each other.
Figure 5B:
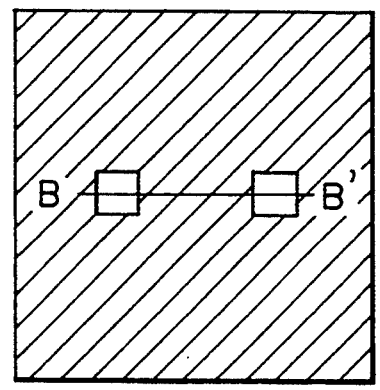
FIG. 5(B) shows two contact holes which are relatively distant from each other.

FIG. 6(A) shows a cross-sectional image intensity distribution along the line A—A' of an image of a pattern in which, as shown in FIG. 5(A), two contact holes of 0.3 by 0.8 $\mu$m square (In terms of measurement on the wafer) are arranged relatively close to each other, i.e., at an edge distance of 0.45 $\mu$m, that is, a distance between two centered of 0.75 $\mu$m (in terms of measurement on the wafer). FIG. 6(B) shows a cross-sectional image intensity distribution along the line B-B' of an image of a pattern in which, as shown in FIG. 5(B), two contact holes of 0.30 by 0.30 μm square (in terms of measurement on the wafer) are arranged relatively far away from each other, i.e., at a distance between two edges of 0.75 μm, that is, at a distance between two centers of 1.05 μm (in terms of measurement on the wafer), which is greater than 0.45 μm in the case of FIG. 6(A). In FIGS. 6(A) and 6(B), the solid line represents an image intensity distribution at the best focus position, the dot-dash line represents an image intensity distribution at a ±1 μm defocus position, and the two-dot and dash line represents an image intensity distribution at a ±2 μm defocus position. Further, Eth in FIGS. 6(A) and 6(B) represents the intensity of exposure light required to completely dissolve a positive photoresist. Accordingly, the slice width of the optical image at the intensity value Eth in the figures is considered to be the diameter of a hole pattern formed on the wafer. It should be noted that the gain (longitudinal magnification) of the optical image in each of FIGS. 6(A) and 6(B) is determined so that the slice width of the optical image at the intensity value Eth is 0.3 μm in terms of the image intensity distribution (solid line) at the best focus position.

As shown in FIGS. 6(A) and 6(B), in the present invention there is substantially no variation in the hole pattern image between the best focus position (solid line) and the ±1 μm defocus position (dot-dash line) (in the figures the hole pattern images at the two positions are substantially superimposed on one another). In other words, it is possible to effect projection exposure of contact hole patterns with an extremely large focal depth. In addition, the present invention provides satisfactory isolating capability (resolving power) for hole patterns, particularly for two hole patterns which are relatively close to each other, as shown in FIG. 6(A), and further has an advantage in that no unwanted transfer (bright peak) occurs between the two holes.

Figure 7A:
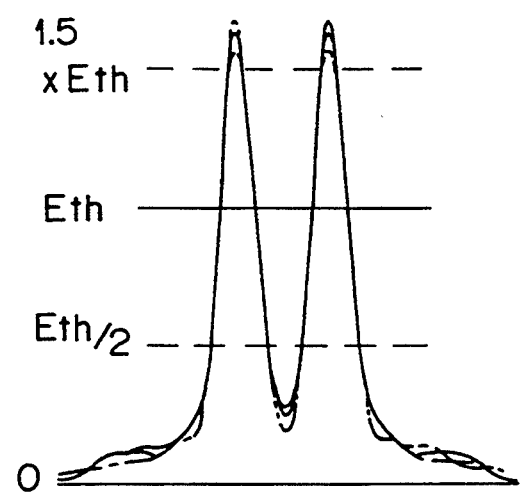
FIGS. 7(A) and 7(B) are graphs each showing results of simulation in which the effect of a second embodiment of the present invention on a plurality of hole patterns is represented by an image intensity distribution.
Figure 7B:
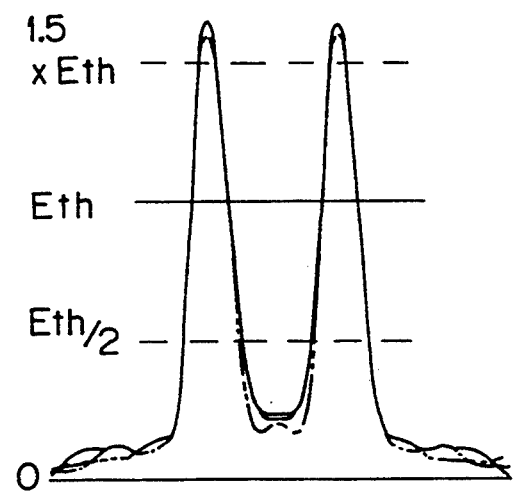

FIGS. 7(A) and 7(B) show results of simulation of optical images carried out under conditions different from those in the case of FIGS. 6(A) and 6(B). In the simulation shown in FIGS. 7(A) and 7(B), the radius $r_1$ of the central transmitting portion FA was $r_1 = 0.22 \times r_2$, and the amplitude transmittance $t_1$ was $t_1 = -1.0$ (these values are the same as in the case of FIGS. 6(A) and 6(B). However, a FLEX method wherein exposure was carried out at each of three discrete positions which were spaced at intervals of 2.0 μm in the optical axis direction, was employed. It should be noted that exposure conditions (NA, σ, λ, etc.) and other conditions such as patterns used were the same as those in the case of FIGS. 6(A) and 6(B). FIGS. 7(A) and 7(B) show optical images of patterns shown in FIGS. 5(A) and 5(B) in the same way as in FIGS. 6(A) and 6(B). In FIGS. 7(A) and 7(B), all the images at the best focus position (solid line), the ±1 μm defocus position (dot-dash line) and the ±2 μm defocus position (two-dot and dash line) are superimposed on one another. That is, the results of the simulation reveal that considerably excellent images can be obtained over an extremely wide range in the focus direction (optical axis direction). In this case also, the capability of separation between adjacent contact holes is extremely high, and ringings are reduced to a satisfactorily low level, as a matter of course.

Figure 8A:
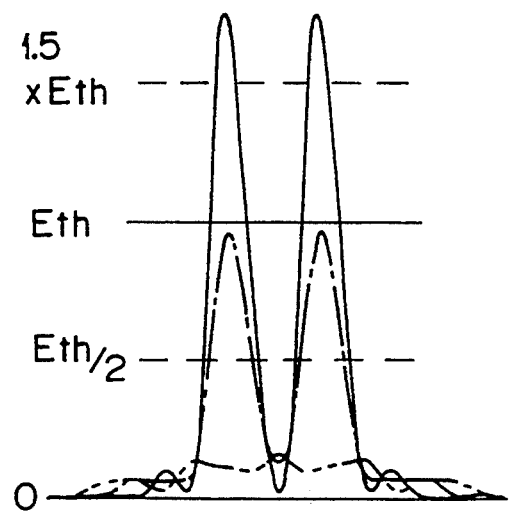
FIGS. 8(A) and 8(B) are graphs each showing results of simulation in which the effect produced by using only the phase type pupil filter of the present invention on a plurality of hole patterns is represented by an image intensity distribution.
Figure 8B:
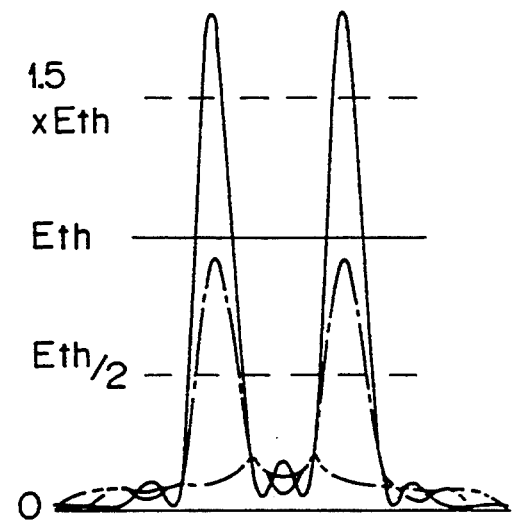

FIGS. 8(A) and 8(B) show results (optical images) of simulation in which pupil filter forming conditions ($r_1$ and $t_1$) were the same as those for the pupil filters according to the present invention (FIGS. 6(A) to 7(B)), but no FLEX method was used in combination. It should be noted that exposure conditions (NA, λ, σ, etc.) and other conditions such as hole patterns used were the same as those in the case of FIGS. 6(A) to 7(B). In FIGS. 8(A) and 8(B) also, ringings are reduced to a satisfactorily low level. However, the image (dot-dash line) at the ±1 μm defocus position is degraded to a considerable extent in comparison to the image (solid line) at the best focus position. Thus, no satisfactory focal depth is obtained. That is, since the phase type pupil filter used in the present invention has no strong focal depth enlarging effect (double focus effect) as obtained with a double focus type pupil filter (described later), it is impossible to expect an adequate improvement in the focal depth unless a FLEX method is used in combination.

Figure 9A:
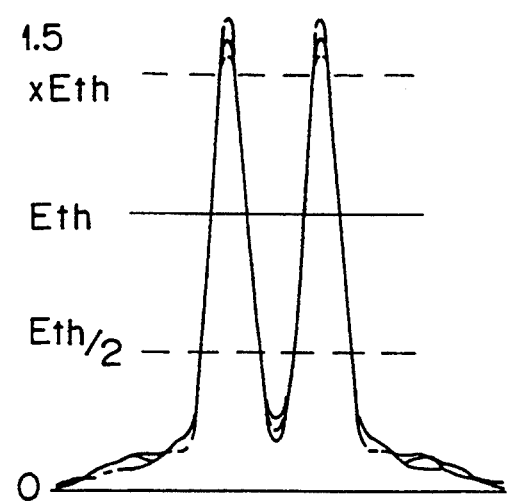
FIGS. 9(A) and 9(B) are graphs each showing results of simulation in which the effect of a third embodiment of the present invention on a plurality of hole patterns is represented by an image intensity distribution.
Figure 9B:
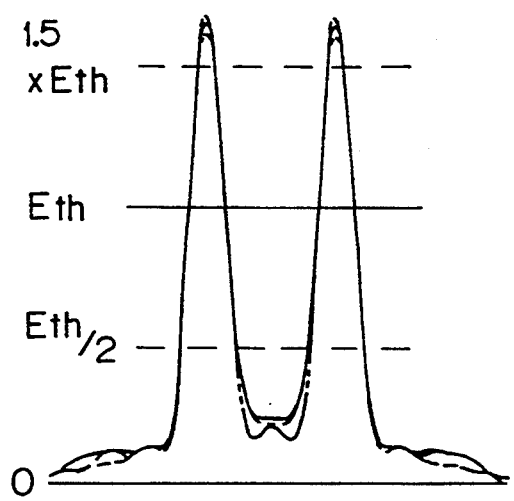

FIGS. 9(A) to 11(B) show results of optical image simulation in which pupil filters formed under conditions different from those in the case of FIGS. 6(A) to 8(B) were used. In FIGS. 9(A) and 9(B), the amplitude transmittance $t_1$ of the circular transmitting portion FA was $t_1 = -0.7$, and the radius $r_1$ was $r_1 = (0.34 + 0.12t)r_2 \approx 0.26r_2$. It should be noted that in this embodiment the amplitude transmittance $t_2$ of the transmitting portion FB is $+1.0$, and hence the ratio $t$ is $t = t_1$. Exposure conditions (NA, σ, λ, etc.) and other conditions such as patterns used were the same as those in the case of FIGS. 6(A) to 7(B). Accordingly, the amount of movement $\Delta F_1$ of the wafer W in the FLEX method was also the same as in the case of FIGS. 6(A) to 7(B) because the numerical aperture NA and the wavelength λ were constant. That is, a FLEX method wherein exposure was carried out at each of three discrete positions spaced at intervals of 2.0 μm in the optical axis direction was employed. In FIGS. 9(A) and 9(B) also, the images are substantially superimposed on one another at each focus position, and thus a satisfactory focal depth is obtained. In addition, the capability of separation between adjacent contact holes is extremely high, and ringings are reduced to a satisfactorily low level.

Figure 10A:
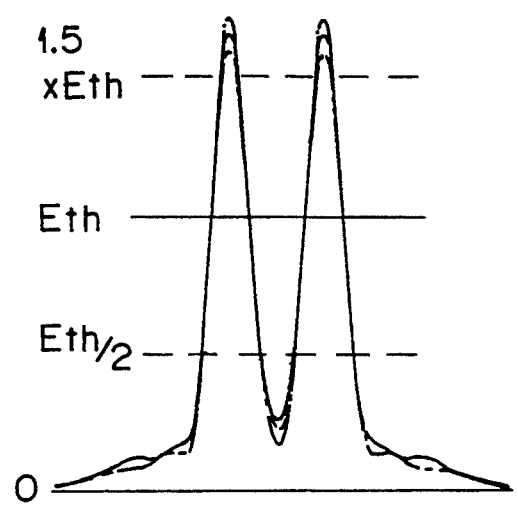
FIGS. 10(A) and 10(B) are graphs each showing results of simulation in which the effect of a fourth embodiment of the present invention on a plurality of hole patterns is represented by an image intensity distribution.
Figure 10B:
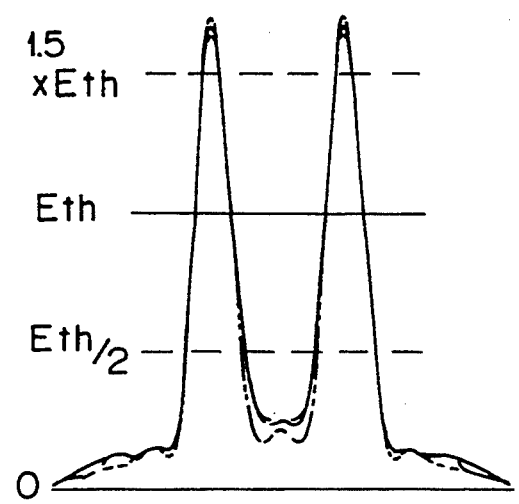
Figure 11A:
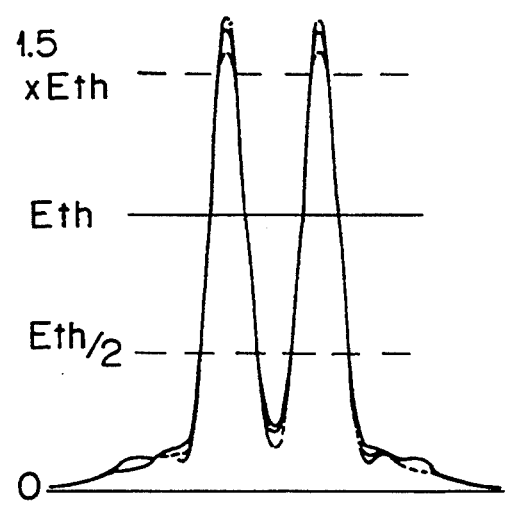
FIGS. 11(A) and 11(B) are graphs each showing results of simulation in which the effect of a fifth embodiment of the present invention on a plurality of hole patterns is represented by an image intensity distribution.
Figure 11B:
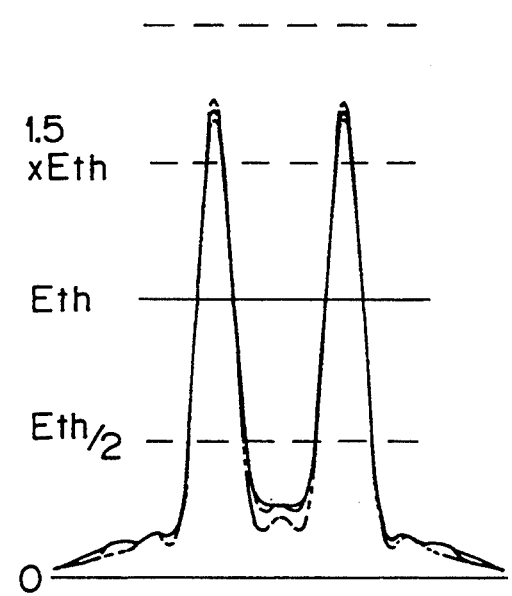

In FIGS. 10(A) and 10(B), the amplitude transmittance $t_1$ was $t = -0.4$, and the radius $r_1$ was $r_1 = (0.34 + 0.12t)r_2 \approx 0.29r_2$. In FIGS. 11(A) and 11(B), the amplitude transmittance $t_1$ was $t_1 = -0.2$, and the radius $r_1$ was $r_1 = (0.34 + 0.12t)r_2 \approx 0.32r_2$. In FIGS. 10(A), 10(B), 11(A) and 11(B) also, the images are substantially superimposed on one another at each focus position, and thus a satisfactory focal depth is obtained. In addition, the capability of separation between adjacent contact holes is extremely high, and ringings are reduced to a satisfactorily low level.

As will be clear from the above-described simulation results [FIGS. 7(A), 7(B) and 9(A) to 11(B)], extremely superior image-forming performance can be obtained in the present invention, provided that the radius $r_1$ and amplitude transmittance $t_1$ (i.e., ratio t) of the phase type pupil filter PF substantially satisfy the relationship $r_1 = (0.34 + 0.12t)r_2$, and that the interval between discrete exposure positions in the FLEX method employed is approximately $$\lambda/(1 - \sqrt{1 - NA^2}).$$

In actual practice, however, as long as the radius $r_1$ satisfies the above condition in a range determined by making allowances of about ±15% for the limits defined by the conditional expression, it is possible to obtain the desired capability of separating a plurality of adjacent contact holes while ensuring a satisfactory focal depth and to reduce ringings to a satisfactorily low level.

Figure 12A:
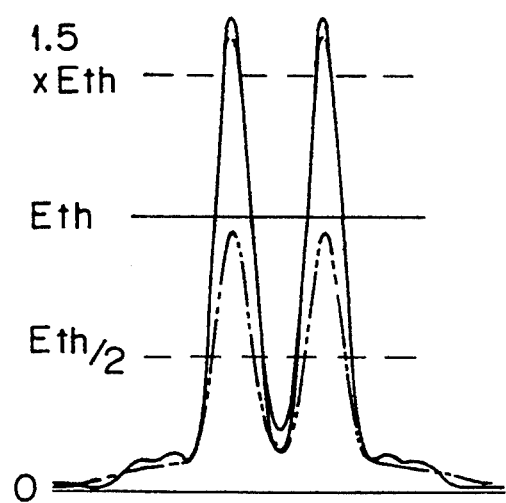
FIGS. 12(A) and 12(B) are graphs each showing results of simulation in which the effect of a sixth embodiment of the present invention on a plurality of hole patterns is represented by an image intensity distribution.
Figure 12B:
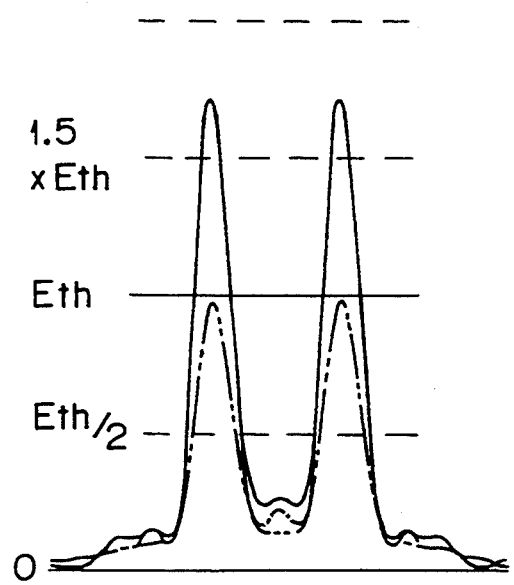

Although in the simulations shown in FIGS. 7(A), 7(B) and 9(A) to 11(B) a FLEX method wherein exposure is carried out at each of three discrete positions is employed, it should be noted that the number of discrete exposure positions in the FLEX method used is not necessarily limited to three but may be any number not less than two. FIGS. 12(A) and 12(B) show results of optical image simulation in which the same pupil filter ($t_1 = -0.2$, and $r_1 = 0.32r_2$) as that employed in FIGS. 11(A) and 11(B) was used in combination with a FLEX method wherein exposure was carried out at each of two discrete positions spaced at an interval of 2 μm in the optical axis direction. In FIGS. 12(A) and 12(B) also, an excellent optical image can be obtained in substantially the same way as in the case of FIGS. 6(A) and 6(B) (where a pupil filter having $t_1 = -1.0$ and $r_1 = 0.22r_2$ was used in combination with a FLEX method wherein exposure was carried out at each of two discrete positions). It should be noted that in FIGS. 6(A) to 14(B), the figures with the suffix (A) show optical images of contact hole patterns which are relatively close to each other as shown in FIG. 5(A), whereas the figures with the suffix (B) show optical images of isolated contact hole patterns which are relatively far away from each other as shown in FIGS. 5(B).

In the above simulations, FLEX methods wherein exposure was carried at each of a plurality of discrete positions were employed, and for the interval $\Delta F_1$ between the plurality of discrete exposure positions, an optimal value obtained from the results of extensive simulation carried out by the present inventor was employed. If the interval $\Delta F_1$ is smaller than the optimal value, no adequate focal depth enlarging effect can be obtained, whereas, if it is larger than the optimal value, the double (or triple) focus phenomenon occurs, making it impossible to obtain a satisfactory focal depth. Further, although in the above simulations the number of plurality of discrete exposure positions in the FLEX method is two or three, it may be four or more. It is also possible to employ a FLEX method wherein the wafer W is continuously moved within a certain range in the optical axis direction during exposure instead of carrying out exposure at each of a plurality of discrete positions. In this case, the range in which the wafer W is continuously moved is preferably set at a value at least approximately double the optimal value $\Delta F_1$ for the interval between the discrete positions.

The following is the reason why the number of discrete points for stepwise movement is two in one case and three in another when the FLEX method wherein the wafer W is stepwisely moved is employed. That is, for a process that does not need a very large focal depth, the FLEX method wherein exposure is carried out at two points is used in combination with the pupil filter, as shown in FIGS. 6(A), 6(B). 12(A) and 12(B). For a process that needs a relatively large focal depth, on the other hand, the FLEX method wherein exposure is carried out at three or more points is used in combination with the pupil filter, as shown in FIGS. 7(A), 7(B), 9(A), 9(B), 10(A), 10(B), 11(A) and 11(B).

When the FLEX method wherein the wafer W is continuously moved along the optical axis during exposure is used in combination with the pupil filter, the amount of movement of the wafer F is set as follows: For a process that does not need a very large focal depth, the amount of wafer movement $\Delta F_2$ is set at about $$2\lambda/(1 - \sqrt{1 - NA^2}),$$

as described above. For a process that needs a relatively large focal depth, the amount of wafer movement $\Delta F_2$ is set at a value larger than the above.

Figure 13A:
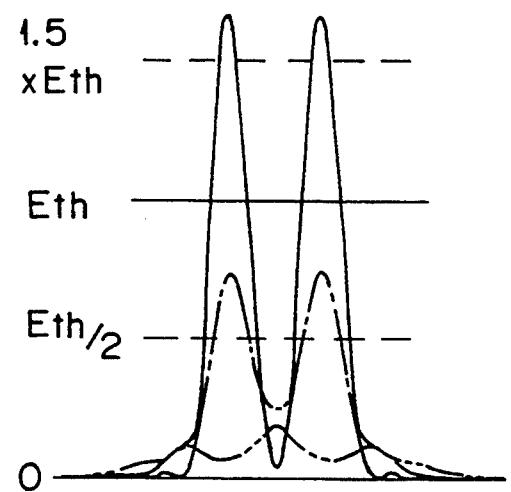
FIGS. 13(A) and 13(B) are graphs each showing results of simulation in which the effect of a conventional ordinary exposure method on a plurality of hole patterns is represented by an image intensity distribution.
Figure 13B:
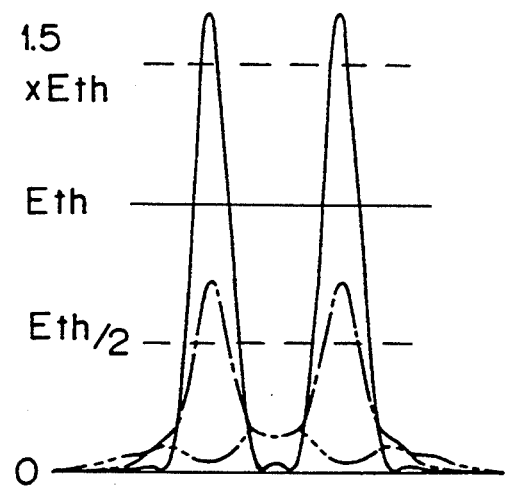

FIGS. 13(A) and 13(B) show the results (optical images) of simulation in which no FLEX method was employed in a conventional ordinary exposure process (using no pupil filter) for comparative purposes. FIG. 13(A) shows optical images of the patterns shown in FIG. 5(A), and FIG. 13(B) shows optical images of the patterns shown in FIG. 5(B). In FIGS. 13(A) and 13(B), since the phase type pupil filter and a FLEX method were not used in combination, the image (dot-dash line) at the ±1 μm defocus position is degraded to a considerable extent in comparison to the image (solid line) at the best focus position. Therefore, it will be understood that no satisfactory focal depth can be obtained with the ordinary image-forming method.

Figure 14A:
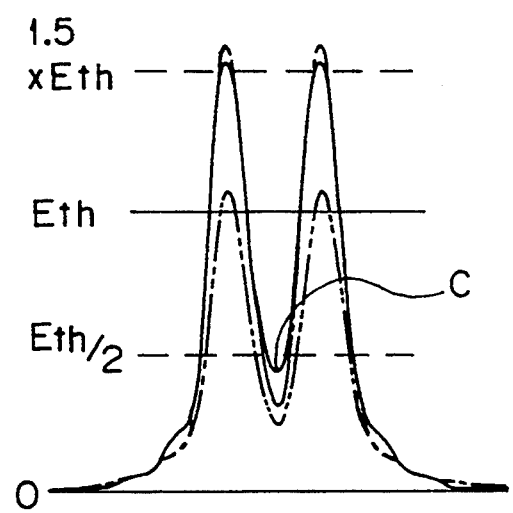
FIGS. 14(A) and 14(B) are graphs each showing results of simulation in which the effect produced by jointly using a conventional ordinary exposure method and a FLEX method on a plurality of hole patterns is represented by an image intensity distribution.
Figure 14B:
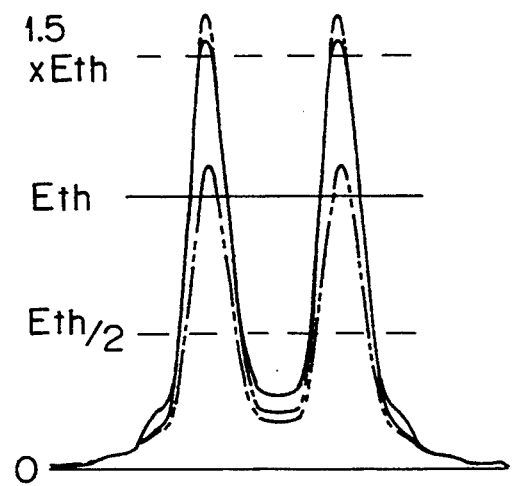

FIGS. 14(A) and 14(B) also show the results of simulation in which a FLEX method was applied to a conventional ordinary exposure process (using no pupil filter) for comparative purposes. In the simulation shown in FIGS. 14(A) and 14(B), the FLEX method was executed under the conditions that exposure was carried out at each of three discrete positions, and the interval between each pair of adjacent exposure positions was 1.5 μm. As will be clear from FIGS. 14(A) and 14(B), the image (dot-dash line) at the ±1 μm defocus position can be made close to the image (solid line) at the best focus position, that is, the focal depth can be increased, by jointly using an ordinary exposure process and a FLEX method. However, in the case of images [FIG. 14(A)] of hole patterns which are close to each other as shown in FIG. 5(A), the two holes cannot satisfactorily be separated, whereby the images of these holes are connected at a portion denoted by reference symbol C in FIG. 14(A), whereas two adjacent holes are completely separated in the case of images [FIG. 14(B)] of a plurality of hole patterns which are arranged relatively far away from each other as shown in FIG. 5(B). The reason for this is that the image intensity at a region between the two holes in FIG. 14(A) is close to Eth /2. It should be noted that in FIGS. 6(A) to 17(B), Eth /2 is assumed to be substantially corresponding to the amount of exposure at which an undesired reduction in film thickness begins on a positive photoresist. Accordingly, with a mere FLEX method, a portion of the photoresist that lies between the two holes is likely to reduce in thickness. In contrast, the images [shown in FIGS. 6(A) to 7(B) and 9(A) to 12(B)] formed by the method according to the present invention have a sufficiently small quantity of light in the region between the two holes and therefore have no likelihood of a reduction in film thickness of the photoresist.

FIGS. 15(A) to 17(B) show the results of simulation in which a conventional double focus type pupil filter (phase contrast filter) alone was used. In FIGS. 15(A) to 17(B), simulation conditions (NA, λ, σ, and focus positions) were the same as those in FIGS. 6(A) to 14(B), but a phase filter formed under conditions different from those in the present invention was employed as a pupil filter. Further, in FIGS. 15(A) to 17(B), a pattern of two holes arranged relatively far away from each other as shown in FIG. 5(B) was used.

Figure 15A:
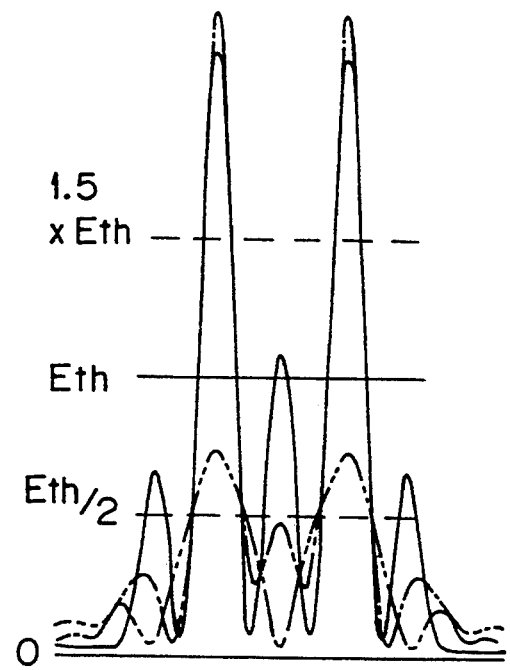
FIG. 15(A) is a graph showing results of simulation in which the effect produced by using only a conventional double focus type filter on a plurality of hole patterns is represented by an image intensity distribution.
Figure 15B:
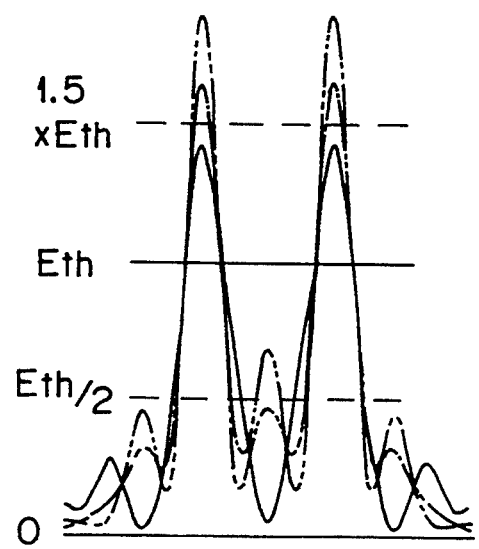
FIG. 15(B) is a graph showing results of simulation in which the effect produced by jointly using a conventional double focus type filter and a FLEX method on a plurality of hole patterns is represented by an image intensity distribution.
Figure 16A:
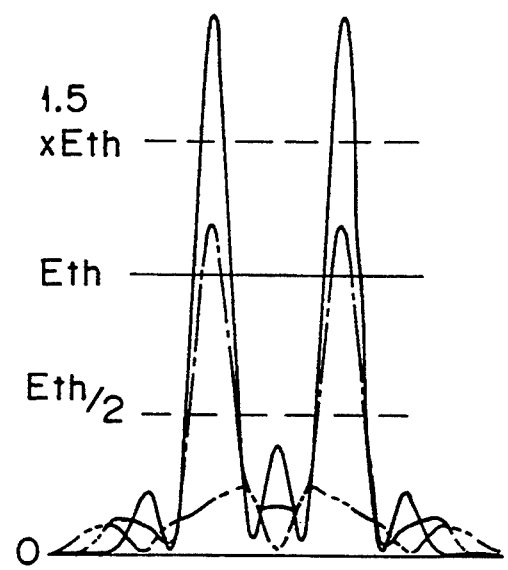
FIG. 16(A) is a graph showing results of simulation in which the effect produced by using only a conventional double focus type filter on a plurality of hole patterns is represented by an image intensity distribution.
Figure 16B:
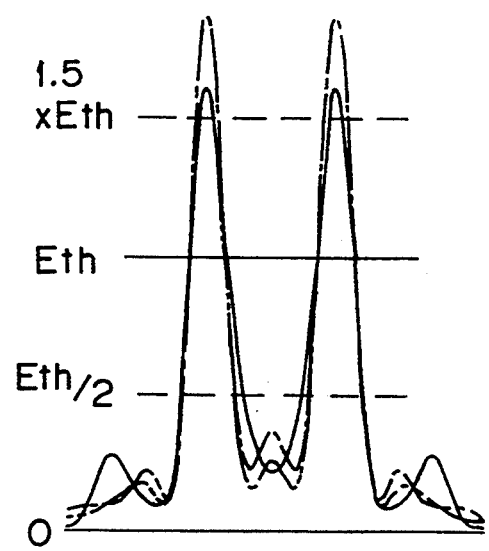
FIG. 16(B) is a graph showing results of simulation in which the effect produced by jointly using a conventional double focus type filter and a FLEX method on a plurality of hole patterns is represented by an image intensity distribution.

In FIGS. 15(A) and 15(B), the radius $r_1$ was $r_1 = 0.4r_2$, and the amplitude transmittance $t_1$ was $t_1 = -1.0$, whereas in FIGS. 16(A) and 16(B), the radius $r_1$ was $r_1 = 0.3r_2$, and the amplitude transmittance $t_1$ was $t_1 = -1.0$. FIGS. 15(A) and 16(A) show optical images formed when no FLEX method was used in combination. FIGS. 15(B) and 16(B) show optical images formed by jointly using a FLEX method wherein exposure was carried out at each of two discrete positions spaced at an optimized interval as described above. In FIG. 15(B), the interval $\Delta F_1$ is 3.5 μm; in FIG. 16(B), the interval $\Delta F_1$ is 2.5 μm.

The pupil filter employed in the simulation shown in FIGS. 15(A) and 15(B) is a conventionally proposed pupil filter having relatively strong double focus effect (focal depth enlarging effect). Therefore, even when no FLEX method is used in combination, the image (solid line) at the best focus position and the image (dot-dash line) at the ±1 μm defocus position are substantially superimposed of one another, as shown in FIG. 15(A). Thus, a large focal depth can be obtained. However, ringings are considerably large, and ringings occurring between the two holes are added together in a region therebetween to form an extremely bright ghost image. As a result, an unwanted hole pattern is transferred to a region between the two holes. Therefore, such a pupil filter cannot be used in actual practice. Further, even when a FLEX method is used in combination, as shown in FIG. 15(B), ringings are still large, although they are somewhat reduced. Therefore, the system cannot be used in actual practice.

In FIGS. 16(A) and 16(B), the radius $r_1$ of the pupil filter is smaller than in the case of FIGS. 15(A) and 15(B). Therefore, ringings somewhat reduce in comparison to FIGS. 15(A) and 15(B), but on the other hand, the focal depth decreases. That is, in FIG. 16(A) the image (dot-dash line) at the ±1 μm defocus position is degraded to a considerable extent in comparison to the image (solid line) at the best focus position. In FIG. 16(B), on the other hand, a satisfactory focal depth can be obtained because the FLEX method is used in combination. However, in FIG. 16(B), ringings that remain even when the FLEX method is used in combination produce an adverse effect. Accordingly, even the image (solid line) at the best focus position has such a deformed configuration that the two holes swell inwardly at the Eth /2 level. Thus, no favorable resist profile (transfer pattern) can be obtained.

Figure 17A:
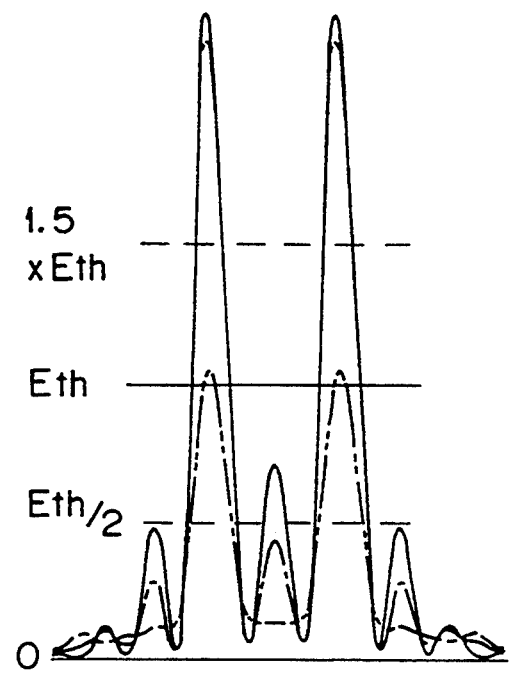
FIG. 17(A) is a graph showing results of simulation in which the effect produced by using only a conventional double focus type filter on a plurality of hole patterns is represented by an image intensity distribution.
Figure 17B:
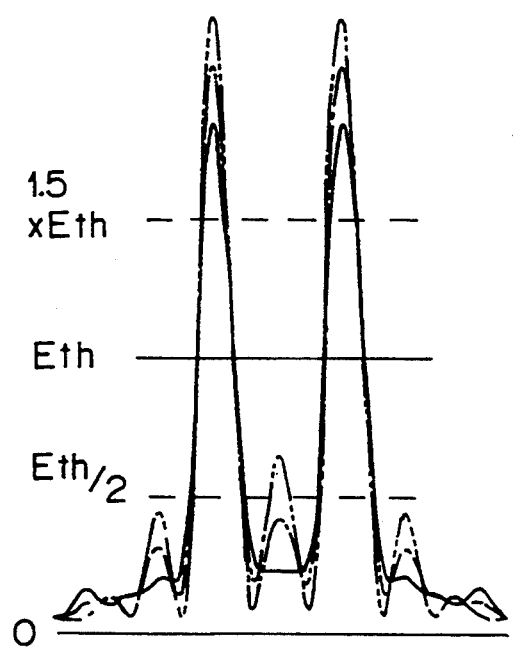
FIG. 17(B) is a graph showing results of simulation in which the effect produced by jointly using a conventional double focus type filter and a FLEX method on a plurality of hole patterns is represented by an image intensity distribution.

FIGS. 17(A) and 17(B) show the results of simulation in which a conventional double focus type pupil filter formed under the conditions different from those in the case of FIGS. 15(A) to 16(B) was used. In FIGS. 17(A) and 17(B), the radius $r_1$ was $r_1 = 0.6r_2$, and the amplitude transmittance $t_1$ was $t_1 = -0.2$. Thus, as a condition for enlarging the focal depth to a certain extent, an absorbance was imparted to the pupil filter (in the pupil filters in FIGS. 15(A) to 16(B), $t_1 = -1.0$). FIG. 17(A) shows an optical image formed when no FLEX method was used in combination. FIG. 17(B) shows an optical image formed when a FLEX method was used in combination. In FIG. 17(B), exposure is carried out at each of two discrete positions spaced at an interval of 4 μm in the optical axis direction. As shown in FIGS. 17(A) and 17(B), in this example, the effect of ringings is large even when the value of the amplitude transmittance $t_1$ is changed, and no favorable optical image can be obtained, although a satisfactory focal depth can be obtained. It should be noted that for the FLEX method used in FIGS. 15(B), 16(B) and 17(B), optimal values of the amount of movement were selected by the present inventor.

In contrast to the above, the present invention uses a pupil filter which has relatively weak focal depth enlarging effect, and optimizes the pupil filter forming conditions and the conditions of a FLEX method used in combination with it. Therefore, it is possible to realize an extremely superior projection exposure apparatus which has a sufficiently large focal depth, sufficiently reduced ringings, and improved capability of separating images of holes which are close to each other, as has already been shown in FIGS. 6(A) to 7(B) and 9(A) to 12(B).

It should be noted that in the foregoing embodiment the pupil filter is formed by depositing a phase shifter on a part of a transparent substrate, whereby the amplitude transmittance $t_1$ of the central circular transmitting portion FA is optimized so as to satisfy the above-described condition. As an alternative example, it is also possible to deposit a phase shifter on the whole surface of a transparent substrate and to give a difference in film thickness between the central transmitting portion FA and the outer transmitting portion FB. In this case, the amplitude transmittances of the transmitting portions FA and FB are used as parameters in optimization.

In the above examples (simulations), the contact hole pattern on the reticle is 0.3 by 0.3 μm square (or diameter) in terms of measurement on the wafer. That is, in the case of a 1/5 reduction system, the contact hole pattern which is 1.5 by 1.5 μm square (or diameter) on the reticle is to be transferred into a pattern which is 0.3 by 0.3 μm square on the wafer. However, the size of the reticle pattern does not necessarily need to be the desired size in terms of measurement on the wafer. For example, transfer may be effected by adjusting the amount of exposure so that a hole pattern which is 2 by 2 μm square on the reticle and which is 0.4 by 0.4 μm in terms of measurement on the wafer is transferred into a pattern which is 0.3 by 0.3 μm square on the wafer.

Incidentally, the amounts of relative movement $\Delta F_1$ and $\Delta F_2$ between the image-forming surface of the projection optical system PL and the wafer W in the FLEX method used in the present invention are not completely limited by the above-described conditional expression. In actuality, practical image-forming characteristics can be obtained within a range determined by making allowances of about ±10% for $\Delta F_1$ and $\Delta F_2$ which are determined by the above conditional expression. (i.e., in the range of 0.9 $\Delta F_1$ to 1.1 $\Delta F_1$; 0.9 $\Delta F_2$ to 1.1 $\Delta F_2$). For example, the amount of movement $\Delta F_1$ may be determined in the following range:

$$0.9 \times \lambda/(1 - \sqrt{1 - NA^2}) \leq \Delta F_1 \leq 1.1 \times \lambda/(1 - \sqrt{1 - NA^2}).$$

It should be noted that in the method wherein the wafer W is vibrated as described above, or in the method proposed in, for example, Japanese Patent Unexamined Publication (KOKAI) No. 05-13305 and U.S. Pat. No. 5,255,050, the amount of movement may be set in a range determined by making allowances of about ±10% for the above-described amplitude of vibration.

Further, the projection exposure apparatus according to the present invention may be used in combination with a halftone phase shift reticle, an edge emphasizing phase shift reticle, etc. which are disclosed in, for example, Japanese Patent Unexamined Publication (KOKAI) Nos. 04-136854 and 04-162039.

What is claimed is:

1. A projection exposure apparatus having an illuminating system for irradiating a mask having a pattern with illuminating light and a projection optical system for taking in light emanating from the pattern of said mask and for projecting an image of said pattern on a photosensitive substrate, said projection exposure apparatus comprising:

a phase plate disposed on or near a Fourier transform plane in an image-forming optical path between said mask and said photosensitive substrate so that an amplitude of light passing through a circular region of radius $r_1$ which is centered at an optical axis of said projection optical system on said Fourier transform plane or a plane near it and an amplitude of light passing through an outer region which lies outwardly of said circular region are made different in sign from each other by said phase plate; and a movable member for moving an image-forming plane of said projection optical system and said photosensitive substrate relative to each other along the optical axis of said projection optical system when the image of said mask pattern is projected on said photosensitive substrate, wherein said radius $r_1$ and a ratio t of the amplitude of light passing through said circular region to the amplitude of light passing through said outer region are determined so as to satisfy the following condition:

$$0.85 \times (0.34 + 0.12t) \leq r_1/r_2 \leq 1.15 \times (0.34 + 0.12t)$$

where $r_2$ is the radius of a pupil plane of said projection optical system.

2. An apparatus according to claim 1, further comprising an exchanging device whereby said phase plate can be inserted into and removed from said image-forming optical path, and when said phase plate is withdrawn from said image-forming optical path, a transparent plane-parallel plate having an optical thickness approximately equal to that of said phase plate is disposed on or near said Fourier transform plane.

3. An apparatus according to claim 2, wherein there are a plurality of said phase plates, said phase plates being different from each other in the radius $r_1$ of said circular region, and said phase plates being alternatively disposed on or near said Fourier transform plane by said exchanging device.

4. An apparatus according to claim 1, wherein said movable member causes the image-forming plane of said projection optical system and said photosensitive substrate to stepwisely move relative to each other, and wherein exposure is carried out at each of a plurality of discrete positions which are apart from each other in the direction of said optical axis by about $$\lambda/(1 - \sqrt{1 - NA^2}),$$

where $\lambda$ is the wavelength of said illuminating light, and NA is the numerical aperture of said projection optical system at the photosensitive substrate side thereof.

5. An apparatus according to claim 1, wherein said movable member causes the image-forming plane of said projection optical system and said photosensitive substrate to continuously move relative to each other in the direction of said optical axis by at least about $$2\lambda/(1 - \sqrt{1 - NA^2}),$$

where $\lambda$ is the wavelength of said illuminating light, and NA is the numerical aperture of said projection optical system at the photosensitive substrate side thereof.

6. An apparatus according to claim 1, wherein said movable member is a plate for mounting said photosensitive substrate.

7. An apparatus according to claim 1, wherein said movable member is said projection optical system.

8. A projection exposure apparatus comprising:

a projection optical system for projecting an image of a pattern formed on a mask onto a photosensitive substrate;

an optical filter disposed on or near a Fourier transform plane in said projection optical system so that an amplitude of light passing through a circular region centered at an optical axis of said projection optical system and an amplitude of light passing through an outer region which lies outwardly of said circular region are made different in sign from each other by said optical filter; and a device for moving an image-forming plane of said projection optical system and said photosensitive substrate relative to each other along the optical axis of said projection optical system by at least about $$\lambda/(1 - \sqrt{1 - NA^2}),$$

where $\lambda$ is the wavelength of light illuminating said mask, and NA is the numerical aperture of said projection optical system at the photosensitive substrate side thereof.

9. An apparatus according to claim 8, wherein a radius $r_1$ of said circular region and a ratio t of the amplitude of light passing through said circular region to the amplitude of light passing through said outer region are determined so as to satisfy the following condition:

$$0.85 \times (0.34 + 0.12t) \leq r_1/r_2 \leq 1.15 \times (0.34 + 0.12t)$$

where $r_2$ is the radius of a pupil plane of said projection optical system.

10. An apparatus according to claim 8, wherein said moving device includes a stage which is movable along the optical axis of said projection optical system with said photosensitive substrate retained thereon.

11. An exposure method that uses a projection optical system, said method comprising the steps of:

disposing an optical filter on or near a Fourier transform plane in said projection optical system so that an amplitude of light passing through a circular region centered at an optical axis of said projection optical system and an amplitude of light passing through an outer region which lies outwardly of said circular region are made different in sign from each other by said optical filter; and moving, when an image of a pattern on a mask is formed on a photosensitive substrate through said projection optical system, an image-forming plane of said projection optical system and said photosensitive substrate relative to each other along the optical axis of said projection optical system by at least about $$\lambda/(1 - \sqrt{1 - NA^2}),$$

where $\lambda$ is the wavelength of light illuminating said mask, and NA is the numerical aperture of said projection optical system at the photosensitive substrate side thereof.

* * * * *